(12) United States Patent
Carroll

(10) Patent No.: US 8,603,855 B1
(45) Date of Patent: Dec. 10, 2013

(54) OPTOELECTRONIC DEVICES AND APPLICATIONS THEREOF

(75) Inventor: David L Carroll, Winston Salem, NC (US)

(73) Assignee: Wake Forest University, Winston-Salem, NC (US)

(*) Notice: Subject to any disclaimer, the term of this patent is extended or adjusted under 35 U.S.C. 154(b) by 0 days.

(21) Appl. No.: 13/880,290

(22) PCT Filed: Oct. 18, 2011

(86) PCT No.: PCT/US2011/056707
§ 371 (c)(1),
(2), (4) Date: Aug. 6, 2013

(87) PCT Pub. No.: WO2012/054477
PCT Pub. Date: Apr. 26, 2012

Related U.S. Application Data

(60) Provisional application No. 61/394,319, filed on Oct. 18, 2010, provisional application No. 61/525,335, filed on Aug. 19, 2011.

(51) Int. Cl.
*H01L 31/028* (2006.01)
*H01L 31/18* (2006.01)
*H01L 31/04* (2006.01)
*H01L 31/0224* (2006.01)

(52) U.S. Cl.
USPC .............. 438/98; 438/72; 136/252; 136/256; 136/258; 257/E31.011; 257/E31.124

(58) Field of Classification Search
None
See application file for complete search history.

(56) References Cited

U.S. PATENT DOCUMENTS

| 5,089,055 A | 2/1992 | Nakamura |
| 2010/0212718 A1 | 8/2010 | Houghton |
| 2010/0229934 A1* | 9/2010 | Jang .............................. 136/256 |
| 2010/0229939 A1 | 9/2010 | Shen |
| 2012/0167963 A1* | 7/2012 | Ovshinsky .................... 136/255 |

OTHER PUBLICATIONS

PCT/US2011/056707 International Search Report and Written Opinion dated Apr. 23, 2012.

* cited by examiner

*Primary Examiner* — Zandra Smith
*Assistant Examiner* — Pamela E Perkins
(74) *Attorney, Agent, or Firm* — J. Clinton Wimbish; Smith Moore Leatherwood LLP

(57) ABSTRACT

In one aspect, optoelectronic devices are described herein. In some embodiments, an optoelectronic device comprises a fiber core, a radiation transmissive first electrode surrounding the fiber core, at least one photosensitive inorganic layer surrounding the first electrode and electrically connected to the first electrode, and a second electrode surrounding the inorganic layer and electrically connected to the inorganic layer. In some embodiments, the device comprises a photovoltaic cell.

16 Claims, 11 Drawing Sheets

OPTOELECTRONIC DEVICES AND APPLICATIONS THEREOF

RELATED APPLICATION DATA

This application claims priority under 35 U.S.C. §119(e) from U.S. Provisional Patent Application Ser. No. 61/394,319, filed on Oct. 18, 2010, and from U.S. Provisional Patent Application Ser. No. 61/525,335, filed on Aug. 19, 2011, the entireties of which are hereby incorporated by reference.

FIELD

The present invention relates to optoelectronic devices and, in particular, to inorganic fiber photovoltaic devices.

BACKGROUND

Photovoltaic devices convert electromagnetic radiation into electricity by producing a photo-generated current when connected across a load and exposed to light. The electrical power generated by photovoltaic cells can be used in many applications, including lighting, heating, battery charging, and powering devices requiring electrical energy.

When irradiated under an infinite load, a photovoltaic device produces its maximum possible voltage, the open circuit voltage or $V_{oc}$. When irradiated with its electrical contacts shorted, a photovoltaic device produces its maximum current, I short circuit or $I_{sc}$. Under operating conditions, a photovoltaic device is connected to a finite load, and the electrical power output is equal to the product of the current and voltage. The maximum power generated by a photovoltaic device cannot exceed the product of $V_{oc}$ and $I_{sc}$. When the load value is optimized for maximum power generation, the current and voltage have the values $I_{max}$ and $V_{max}$, respectively.

A key characteristic in evaluating a photovoltaic cell's performance is the fill factor, ff. The fill factor is the ratio of the photovoltaic cell's actual power to its power if both current and voltage were at their maxima. The fill factor of a photovoltaic cell is provided according to equation (1).

$$ff=(I_{max}V_{max})/(I_{sc}V_{oc}) \quad (1)$$

The fill factor of a photovoltaic is always less than 1, as $I_{sc}$ and $V_{oc}$ are never obtained simultaneously under operating conditions. Nevertheless, as the fill factor approaches a value of 1, a device demonstrates less internal resistance and, therefore, delivers a greater percentage of electrical power to the load under optimal conditions.

Photovoltaic devices may additionally be characterized by their efficiency of converting electromagnetic energy into electrical energy. The conversion efficiency, $\eta_p$, of a photovoltaic device is provided according to equation (2), where $P_{inc}$ is the power of the light incident on the photovoltaic.

$$\eta_p=f\!f^*(I_{sc}V_{oc})/P_{inc} \quad (2)$$

Devices utilizing crystalline or amorphous silicon dominate commercial applications. However, many commercially available silicon-based photovoltaic cells are difficult and expensive to produce or exhibit significant performance degradation over the lifetime of the device.

SUMMARY

In one aspect, optoelectronic devices are described herein. In some embodiments, an optoelectronic device comprises a fiber core, a radiation transmissive first electrode surrounding the fiber core, at least one photosensitive inorganic layer surrounding the first electrode and electrically connected to the first electrode, and a second electrode surrounding the inorganic layer and electrically connected to the inorganic layer.

In some embodiments, the at least one photosensitive inorganic layer comprises a polycrystalline material. In some embodiments, a polycrystalline material comprises microcrystalline grains, nanocrystalline grains or combinations thereof. In some embodiments, the at least one photosensitive inorganic layer comprises an amorphous material. In some embodiments, the at least one photosensitive layer has a thickness less than about 1 μm or less than about 500 nm. The at least one photosensitive layer, in some embodiments, has a thickness less than about 400 nm or less than about 300 nm.

In some embodiments, the at least one photosensitive inorganic layer comprises copper zinc tin sulfide (CZTS). In some embodiments, the at least one photosensitive inorganic layer comprises amorphous silicon. In some embodiments, amorphous silicon of an inorganic photosensitive layer described herein is unpassivated or passivated with hydrogen. Moreover, in some embodiments, amorphous silicon of an inorganic photosensitive layer described herein is not passivated with a halogen. In some embodiments, for example, amorphous silicon of an inorganic photosensitive layer does not comprise or does not substantially comprise fluorinated amorphous silicon (a-Si:F). In other embodiments, amorphous silicon of an inorganic photosensitive layer described herein is passivated with a halogen, such as fluorine to provide a-Si:F.

In some embodiments, an optoelectronic device described herein comprises a plurality of photosensitive inorganic layers. In some embodiments, the absorption profiles of the plurality of photosensitive inorganic layers do not substantially overlap. In some embodiments, the absorption profiles of the plurality of photosensitive inorganic layers at least partially overlap.

In some embodiments, optoelectronic devices described herein are photovoltaic cells. In some embodiments, photovoltaic cells described herein have a conversion efficiency of at least about 3%. In some embodiments, a photovoltaic cell described herein has conversion efficiency of at least about 5% or at least about 10%. In some embodiments, a photovoltaic cell described herein has a conversion efficiency ranging from about 5% to about 15% or from about 7% to about 12%. In some embodiments, a photovoltaic cell described herein has a conversion efficiency ranging from about 10% to about 20%. In some embodiments, a photovoltaic cell described herein has a conversion efficiency greater than 20%.

In some embodiments wherein a photovoltaic cell described herein comprises an amorphous silicon photosensitive layer, the photovoltaic cell displays less than a 20% reduction or less than a 15% reduction in initial conversion efficiency resulting from the Staebler-Wronski effect (SWE). In some embodiments, a photovoltaic cell described herein comprising an amorphous silicon photosensitive layer displays less than a 10% or less than a 5% reduction in initial conversion efficiency resulting form the Staebler-Wronski effect. In some embodiments, a photovoltaic cell described herein comprising an amorphous silicon photosensitive layer displays less than a 3% or less than a 2% reduction in initial conversion efficiency resulting form the Staebler-Wronski effect.

Moreover, in some embodiments, a photovoltaic cell described herein demonstrates a conversion efficiency ranging from about 9% to about 12% over the lifetime of the cell. In some embodiments, a photovoltaic cell described herein demonstrates a conversion efficiency from about 10% to about 15% over the lifetime of the cell.

In some embodiments, a photovoltaic cell described herein is operable to capture up to about 70% of the incident luminous flux. Additionally, in some embodiments, the illuminance of the at least one photosensitive inorganic layer is less than or equal to the illuminance at an irradiated end of the fiber core divided by the aspect ratio of the fiber core.

In another aspect, an optoelectronic device is described herein comprising at least one pixel comprising at least one photovoltaic cell, the photovoltaic cell comprising a fiber core, a radiation transmissive first electrode surrounding the fiber core, at least one photosensitive inorganic layer surrounding the first electrode and electrically connected to the first electrode, and a second electrode surrounding the photosensitive inorganic layer and electrically connected to the photosensitive inorganic layer. In some embodiments, the at least one pixel comprises a plurality of photovoltaic cells described herein. In some embodiments, the optoelectronic device comprises an array of pixels. In some embodiments, a photovoltaic cell of a pixel can have any of the properties described herein for a photovoltaic cell.

In another aspect, tapered optoelectronic devices are described herein. In some embodiments, an optoelectronic device comprises a fiber core having a tapered end and a non-tapered end, a radiation transmissive first electrode surrounding the fiber core, at least one photosensitive inorganic layer surrounding the first electrode and electrically connected to the first electrode, and a second electrode surrounding the inorganic layer and electrically connected to the inorganic layer.

In another aspect, multispectral tapered optoelectronic devices are described herein. In some embodiments, a multispectral tapered optoelectronic device comprises a fiber core having a tapered end, a non-tapered end, and a plurality of photosensitive regions located along the longitudinal axis of the fiber core, each of the plurality of photosensitive regions comprising a radiation transmissive first electrode surrounding the fiber core, at least one photosensitive inorganic layer surrounding the first electrode and electrically connected to the first electrode, and a second electrode surrounding the photosensitive inorganic layer and electrically connected to the photosensitive inorganic layer.

In another aspect, optoelectronic devices are provided herein comprising at least one pixel comprising at least one photovoltaic cell, the photovoltaic cell comprising a fiber core having a tapered end and a non-tapered end, a radiation transmissive first electrode surrounding the fiber core, at least one photosensitive inorganic layer surrounding the first electrode and electrically connected to the first electrode, and a second electrode surrounding the inorganic layer and electrically connected to the inorganic layer. In some embodiments, a photovoltaic cell of a pixel comprises a plurality of photosensitive inorganic layers. In some embodiments, an optoelectronic device comprises a plurality of pixels. In some embodiments, the device comprises an array of pixels. In some embodiments comprising an array of pixels, each pixel comprises a photovoltaic cell comprising a fiber core having a tapered end and a non-tapered end, a radiation transmissive first electrode surrounding the fiber core, at least one photosensitive inorganic layer surrounding the first electrode and electrically connected to the first electrode, and a second electrode surrounding the inorganic layer and electrically connected to the inorganic layer.

In another aspect, methods of producing optoelectronic devices are described herein. In some embodiments, a method of producing an optoelectronic device comprises providing a fiber core, disposing a radiation transmissive first electrode on a surface of the fiber core, disposing at least one photosensitive inorganic layer in electrical communication with the first electrode, and disposing a second electrode in electrical communication with the photosensitive inorganic layer, wherein the photosensitive inorganic layer has a thickness less than about 500 nm. In some embodiments, the photosensitive inorganic layer has a thickness less than about 400 nm or less than about 300 nm. In some embodiments, the photosensitive inorganic layer has a thickness less than about 250 nm. In some embodiments, the photosensitive inorganic layer has a thickness ranging from about 100 nm to about 300 nm.

In some embodiments of methods of producing an optoelectronic device described herein, a photosensitive inorganic layer comprises amorphous silicon. In some embodiments, the amorphous silicon is unpassivated or passivated with hydrogen. In some embodiments, the amorphous silicon is not passivated with a halogen, such as fluorine.

In some embodiments, an optoelectronic device produced according to methods described herein demonstrates a photovoltaic conversion efficiency of at least about 3%. In some embodiments, an optoelectronic device demonstrates a conversion efficiency of at least about 5% or at least about 10%. In some embodiments, an optoelectronic device demonstrates a conversion efficiency ranging from about 5% to about 20% or from about 7% to about 15%.

In another aspect, methods of converting electromagnetic energy into electrical energy are described herein. In some embodiments, a method of converting electromagnetic energy into electrical energy comprises receiving electromagnetic radiation along the longitudinal axis of an optical fiber, transmitting the radiation into at least one photosensitive inorganic layer through a radiation transmissive electrode surrounding the optical fiber, generating excitons in the photosensitive inorganic layer, and separating the excitons into electrons and holes. In some embodiments, the at least one photosensitive inorganic layer comprises any photosensitive inorganic layer described herein.

In another aspect, methods of reducing efficiency losses in amorphous silicon photovoltaic devices resulting from the Staebler-Wronski effect are described herein. In some embodiments, a method comprises reducing efficiency loss in an amorphous silicon photovoltaic device resulting from the Staebler-Wronski effect, wherein reducing comprises disposing an amorphous silicon photosensitive layer in electrical communication with a radiation transmissive first electrode surrounding a fiber core, disposing a non-radiation transmissive second electrode in electrical communication with the amorphous silicon photosensitive layer, receiving electromagnetic radiation along the longitudinal axis of the fiber core and transmitting the radiation into the amorphous silicon photosensitive layer for the generation of a photocurrent. In some embodiments, the amorphous silicon photosensitive layer surrounds the radiation transmissive first electrode, and the second electrode surrounds the amorphous silicon photosensitive layer. In some embodiments, the amorphous silicon photovoltaic device demonstrates less than about a 20% reduction or less than about a 15% reduction in initial conversion efficiency from the Staebler-Wronski effect. In some embodiments, the amorphous silicon photovoltaic device displays less than about a 10% reduction in initial conversion efficiency from the Staebler-Wronski effect. The amorphous silicon photovoltaic device, in some embodiments, demonstrates less than about a 5% reduction in initial conversion efficiency or less than about a 3% reduction in initial conversion efficiency Staebler-Wronski effect. Moreover, in some embodiments, the amorphous silicon photosensitive layer is hydrogen passivated (a-Si:H). In some embodiments, the amorphous silicon photosensitive layer is non-halogen passivated. Alternatively, in some embodiments, the amorphous silicon photosensitive layer is fluorine passivated (a-Si:F).

These and other embodiments are described in greater detail in the detailed description which follows.

DETAILED DESCRIPTION

Figure 1:
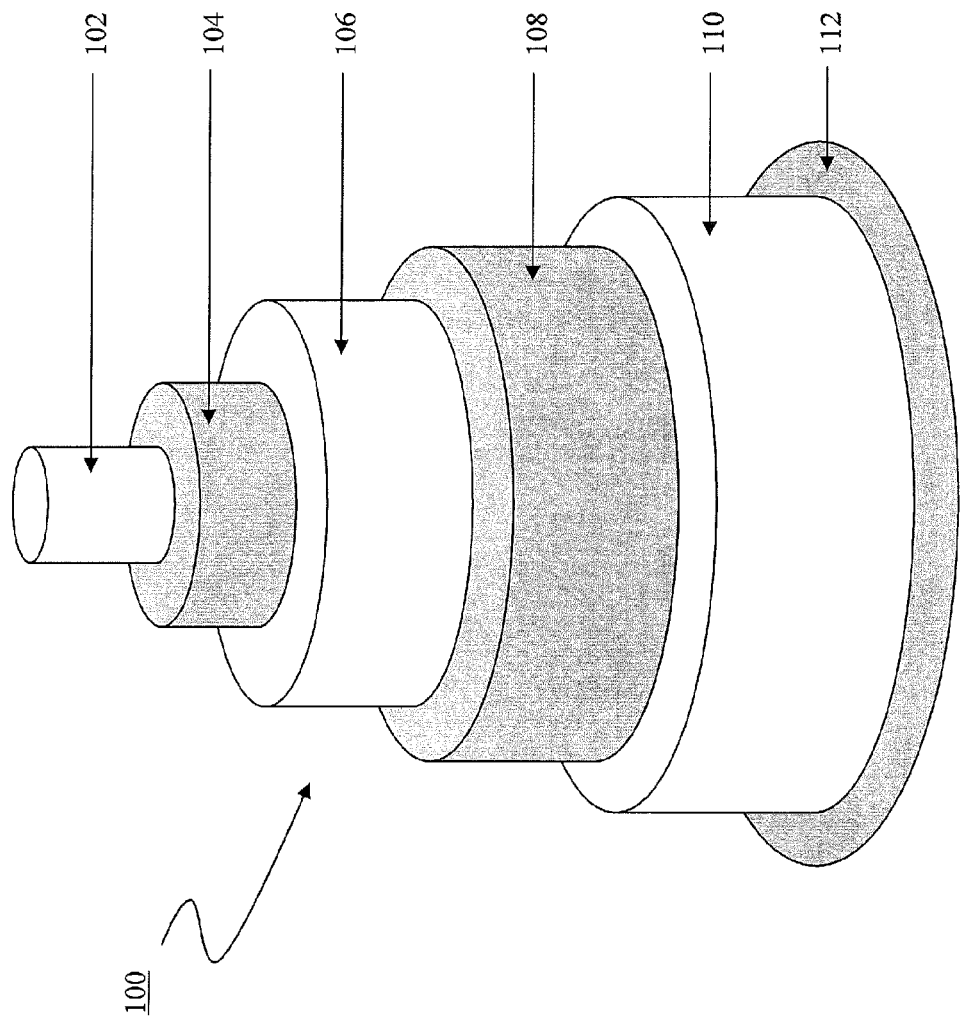
FIG. 1 illustrates a cut away view of an optoelectronic device comprising a fiber structure according to one embodiment described herein.

Embodiments described herein can be understood more readily by reference to the following detailed description, example, and drawings. Elements, apparatus, and methods described herein, however, are not limited to the specific embodiments presented in the detailed description, example, and drawings. It should be recognized that these embodiments are merely illustrative of the principles of the present invention. Numerous modifications and adaptations will be readily apparent to those of skill in the art without departing from the spirit and scope of the invention.

In addition, all ranges disclosed herein are to be understood to encompass any and all subranges subsumed therein. For example, a stated range of "1.0 to 10.0" should be considered to include any and all subranges beginning with a minimum value of 1.0 or more and ending with a maximum value of 10.0 or less, e.g., 1.0 to 5.3, or 4.7 to 10.0, or 3.6 to 7.9.

In one aspect, optoelectronic devices are described herein. In some embodiments, an optoelectronic device comprises a fiber core, a radiation transmissive first electrode surrounding the fiber core, at least one photosensitive inorganic layer surrounding the first electrode and electrically connected to the first electrode, and a second electrode surrounding the photosensitive inorganic layer and electrically connected to the photosensitive inorganic layer. In some embodiments, the device comprises a photovoltaic cell.

Turning now to components that can be included in various embodiments of optoelectronic devices described herein, optoelectronic devices described herein comprise a fiber core. The fiber core, in some embodiments, comprises an optical fiber. Optical fibers suitable for use in some embodiments comprise one or more of glass optical fibers, quartz optical fibers, and plastic optical fibers (POF). Plastic optical fibers, in some embodiments, can be constructed of polymethylmethacrylate. In other embodiments, plastic optical fibers can be constructed of perfluorocyclobutane (PFBC) containing polymers, such as perfluorocyclobutane poly(arylether)s. Optical fibers, in some embodiments, can comprise single mode optical fibers and/or multi-mode optical fibers. In some embodiments, optical fibers can be flexible.

A fiber core of an optoelectronic device described herein can have any desired diameter. In some embodiments, a fiber core of an optoelectronic device described herein can have a diameter ranging from about 1 µm to about 2 mm. In other embodiments, a fiber core can have a diameter ranging from about 90 µm to about 1 mm. In some embodiments, a fiber core can have a diameter ranging from about 20 µm to about 800 µm.

A fiber core of an optoelectronic device described herein can have any desired length. A fiber core of an optoelectronic device described herein, in some embodiments, can have a length ranging from about 500 nm to about 100 mm. In other embodiments, a fiber core can have a length ranging from about 1 µm to about 1 mm. In some embodiments, a fiber core can have a length ranging from about 10 µm to about 100 µm.

Fiber cores of optoelectronic devices described herein, in some embodiments, can further comprise one or more upconverters. As understood by one of skill in the art, an upconverter is a material operable to emit electromagnetic radiation having energy greater than that of the electromagnetic radiation absorbed by the material to create the excited state. Upconverters suitable for use in some embodiments, for example, can absorb infrared radiation and emit visible radiation. In some embodiments, the emitted radiation has a wavelength operable to be absorbed by one or more photosensitive inorganic layers of optoelectronic devices described herein.

Upconverters, in some embodiments, can include materials comprising at least one Lanthanide series element. In some embodiments, upconverter materials can comprise nanoparticles comprising at least one Lanthanide series element. Lanthanide series elements suitable for use in upconverter materials in some embodiments comprise erbium, ytterbium, dysprosium, holmium, or mixtures thereof. In some embodiments, upconverter materials comprise metal oxides and/or metal sulfides doped with ions of erbium, ytterbium, dysprosium, holmium, or mixtures thereof. In other embodiments, fiber cores or optical fibers may be doped directly with ions of erbium, ytterbium, dysprosium, holmium, or mixtures thereof.

In some embodiments, upconverter materials can comprise organic chemical species. For example, in some embodiments, an organic upconverter materials can comprise one or more of 4-dialkylamino-1,8-naphthalimides, and 1,8-naphthalimide derivatives and compounds, such as multibranched naphthalimide derivatives TPA-NA1, TPA-NA2, and TPA-NA3. In some embodiments, organic upconverter materials can also comprise one or more of 4-(dimethylamino)cinnamonitrile (cis and trans), trans-4-[4-(dimethylamino)styryl]-1-methylpyridinium iodide, 4-[4-(dimethylamino)styryl]pyridine, 4-(diethylamino)benzaldehyde diphenylhydrazone, trans-4-[4-(dimethylamino)styryl]-1-methylpyridinium p-toluenesulfonate, 2-[ethyl [4-[2-(4-nitrophenyl)ethenyl] phenyl]amino]ethanol, 4-dimethylamino-4'-nitrostilbene, Disperse Orange 25, Disperse Orange 3, and Disperse Red 1.

In some embodiments, upconverter materials can comprise quantum dots. Quantum dots, in some embodiments, can comprise III/V and/or II/VI semiconductor materials, such as cadmium selenide (CdSe), cadmium telluride (CdTe), and zinc selenide (ZnSe). Upconverter materials, in some embodiments, can also comprise core-shell quantum dots.

In some embodiments, upconverter materials can comprise transition metals, such as chromium.

In some embodiments, fiber cores of optoelectronic devices described herein comprise one or more downconverters. As understood by one of skill in the art, a downconverter is a material operable to emit electromagnetic radiation having energy less than that of the electromagnetic radiation absorbed by the material to create the excited state.

Upconverters and/or downconverters, in some embodiments, can be disposed within the fiber core of an optoelectronic device described herein. In some embodiments, upconverters and/or downconverters can be disposed on a surface of the fiber core. In some embodiments, upconverters and/or downconverters can be disposed on a surface of the fiber core at the interface of the fiber core with the radiation transmissive first electrode.

Fiber cores of optoelectronic devices described herein, in some embodiments, can further comprise at least one scattering agent. In some embodiments, a fiber core can comprise a plurality of scattering agents. Scattering agents, in some embodiments, can scatter electromagnetic radiation propagating along the longitudinal axis of the fiber core. In some embodiments, scattering agents can scatter the electromagnetic radiation radially outward from the fiber core, permitting absorption of the scattered radiation by one or more photosensitive inorganic layers surrounding the fiber core.

Scattering agents, in some embodiments, can comprise transition metal nanoparticles. Transition metals suitable for use as scattering agents, in some embodiments, can comprise one or more of gold, silver, copper, niobium, palladium, and platinum. Transition metal nanoparticles, in some embodiments, can comprise nanorods or nanowires. In one embodiment, for example, a scattering agent comprises a transition metal nanorod or nanowire having a diameter ranging from about 2 nm to about 50 nm.

Optoelectronic devices described herein also comprise a radiation transmissive first electrode surrounding the fiber core. Radiation transmissive, as used herein, refers to the ability of a material to at least partially pass or transmit radiation in the visible region of the electromagnetic spectrum. In some embodiments, radiation transmissive materials can pass electromagnetic radiation suitable for absorption by photosensitive inorganic layers described herein with minimal absorbance or other interference. Moreover, electrode, as used herein, refers to a layer that provides a medium for delivering photogenerated current to an external circuit or providing bias voltage to the optoelectronic device. In some embodiments, an electrode provides an interface between the photoactive regions of an optoelectronic device and a wire, lead, trace, or other means for transporting the charge carriers to or from an external circuit.

A radiation transmissive first electrode, according to some embodiments, comprises a radiation transmissive conducting oxide. Radiation transmissive conducting oxides, in some embodiments, can comprise one or more of indium tin oxide (ITO), gallium indium tin oxide (GITO), and zinc indium tin oxide (ZITO).

In some embodiments, a radiation transmissive first electrode comprises one or more radiation transmissive polymeric materials, such as polyanaline (PANI) and its chemical relatives. In some embodiments, a radiation transmissive first electrode comprises 3,4-polyethylenedioxythiophene (PEDOT). In some embodiments, a radiation transmissive first electrode comprises a carbon nanotube layer having a thickness operable to at least partially pass visible electromagnetic radiation. In some embodiments, a radiation transmissive first electrode comprises a composite material comprising a nanoparticle phase dispersed in a polymeric phase. The nanoparticle phase, in some embodiments, can comprise carbon nanotubes, fullerenes, or mixtures thereof. In some embodiments, a radiation transmissive first electrode can comprise a metal layer having a thickness operable to at least partially pass visible electromagnetic radiation. In some embodiments, the metal layer can comprise elementally pure metals or alloys. Metals suitable for use as a radiation transmissive first electrode, in some embodiments, can comprise high work function metals.

In some embodiments, the radiation transmissive first electrode has a thickness ranging from about 10 nm to about 1 μm. In other embodiments, the radiation transmissive first electrode has a thickness ranging from about 100 nm to about 900 nm. In some embodiments, a radiation transmissive first electrode has a thickness ranging from about 200 nm to about 800 nm. In some embodiments, a radiation transmissive first electrode has a thickness greater than about 1 μm.

Optoelectronic devices described herein also comprise at least one photosensitive inorganic layer. Optoelectronic devices, in some embodiments, comprise a plurality of photosensitive inorganic layers.

A photosensitive inorganic layer of an optoelectronic device described here can have any thickness not inconsistent with the objectives of the present invention. In some embodiments, a photosensitive inorganic layer of an optoelectronic device described herein has a thickness selected from the values provided in Table I

TABLE I

| Photosensitive Inorganic Layer Thickness |
|---|
| ≤5 μm |
| ≤3 μm |
| ≤1 μm |
| ≤500 nm |
| ≤300 nm |
| ≤250 nm |
| ≤200 nm |
| ≤100 nm |
| 50 nm to 500 nm |
| 75 nm to 400 nm |
| 100 nm to 300 nm |
| 50 nm to 500 nm |
| 50 nm to 300 nm |
| 100 nm to 200 nm |
| 25 nm to 100 nm |
| 20 nm to 80 nm |
| 15 nm to 75 nm |
| 10 nm to 60 nm |
| 50 nm to 100 nm |
| 10 nm to 500 nm |
| 10 nm to 250 nm |
| 10 nm to 200 nm |
| 10 nm to 175 nm |
| 10 nm to 150 nm |
| 10 nm to 125 nm |
| 10 nm to 100 nm |
| 20 nm to 500 nm |
| 20 nm to 250 nm |
| 20 nm to 200 nm |

TABLE I-continued

Photosensitive Inorganic Layer Thickness 20 nm to 175 nm
20 nm to 150 nm
20 nm to 125 nm
20 nm to 100 nm A photosensitive inorganic layer of an optoelectronic device described herein, in some embodiments, can exhibit various structures. In some embodiments, the at least one photosensitive inorganic layer comprises a crystalline material. In some embodiments, the at least one photosensitive inorganic layer comprises a single crystalline material.

In some embodiments, the at least one photosensitive inorganic layer comprises a polycrystalline material. In some embodiments, a polycrystalline material comprises microcrystalline grains, nanocrystalline grains or combinations thereof. In some embodiments, for example, a polycrystalline material has an average grain size less than about 1 μm. In some embodiments, a polycrystalline material has an average grain size less than about 500 nm, less than about 300 nm, less than about 250 nm, or less than about 200 nm. In some embodiments, a polycrystalline material has an average grain size less than about 100 nm. In some embodiments, a polycrystalline material has an average grain size between about 5 nm and about 1 μm. In some embodiments, a polycrystalline material has an average grain size between about 10 nm and about 500 nm, or between about 50 nm and about 250 nm, or between about 50 nm and about 150 nm. In some embodiments, a polycrystalline material has an average grain size between about 10 nm and about 100 nm or between about 10 nm and about 80 nm.

Photosensitive inorganic layers of optoelectronic devices described herein, in some embodiments, can have various compositions. In some embodiments, a photosensitive inorganic layer of an optoelectronic device described herein comprises an inorganic composition comprising a group IV semiconductor material, a group II/VI semiconductor material (such as CdTe), a group III/V semiconductor material, or combinations or mixtures thereof. In some embodiments, a photosensitive inorganic layer comprises a group IV, group II/VI, or group III/V binary, ternary or quaternary system. In some embodiments, a photosensitive inorganic layer comprises a I/III/VI material, such as copper indium gallium selenide (CIGS). In some embodiments, a photosensitive inorganic layer of an optoelectronic device described herein comprises polycrystalline silicon (Si). In some embodiments, a photosensitive inorganic layer described herein comprises microcrystalline, nanocrystalline, and/or protocrystalline silicon. In some embodiments, a photosensitive inorganic layer of an optoelectronic device described herein comprises polycrystalline copper zinc tin sulfide (CZTS). In some embodiments, a photosensitive inorganic layer described herein comprises microcrystalline, nanocrystalline, and/or protocrystalline CZTS. In some embodiments of optoelectronic devices described herein comprising at least one photosensitive inorganic layer comprising CZTS, the CZTS comprises $Cu_2ZnSnS_4$. In some embodiments, the CZTS further comprises selenium (Se). In some embodiments, the CZTS further comprises gallium (Ga). In some embodiments, any of the foregoing crystalline materials of the photosensitive inorganic layer can have any grain size described herein.

In some embodiments, a photosensitive inorganic layer of an optoelectronic device described herein comprises an amorphous material. In some embodiments, at least one photosensitive inorganic layer comprises amorphous silicon (a-Si). In some embodiments, amorphous silicon of a photosensitive inorganic layer is unpassivated or substantially unpassivated. In some embodiments, amorphous silicon of a photosensitive inorganic layer is passivated with hydrogen (a-Si:H). In some embodiments, amorphous silicon of a photosensitive inorganic layer is not passivated with a halogen or is non-halogen passivated. In some embodiments, for example, amorphous silicon of a photosensitive inorganic layer comprises no or substantially no Si:F. Alternatively, in some embodiments, amorphous silicon of a photosensitive inorganic layer is fluorine passivated (a-Si:F).

In some embodiments, any of the foregoing amorphous silicon photosensitive layers can have a thickness selected from Table I hereinabove.

Optoelectronic devices described herein comprising at least one photosensitive inorganic layer comprising amorphous silicon can, in some embodiments, provide one or more advantages. For example, in some embodiments, the amorphous silicon comprises substantially unpassivated or hydrogen passivated amorphous silicon, thereby permitting simpler and cheaper device fabrication with respect to devices employing fluorine passivation.

An optoelectronic device described herein, in some embodiments, comprises a plurality of photosensitive inorganic layers described herein. In some embodiments, an optoelectronic device described herein comprises a fiber core, a radiation transmissive first electrode surrounding the fiber core, a plurality of photosensitive inorganic layers surrounding the first electrode and electrically connected to the first electrode, and a second electrode surrounding the plurality of photosensitive inorganic layers and electrically connected to the plurality of photosensitive inorganic layers.

In some embodiments of optoelectronic devices described herein, one or more photosensitive inorganic layers comprise at least one heterojunction. In some embodiments, the at least one heterojunction is established between surfaces of adjacent donor and acceptor materials. For example, in some embodiments, the at least one heterojunction is established between surfaces of CZTS and a polymeric material. In some embodiments, the at least one heterojunction is established between surfaces of CZTS and a II/VI material, such as CdTe. In some embodiments, exciton dissociation is precipitated at one or more heterojunctions of one or more photosensitive inorganic layers.

In some embodiments, one or more heterojunctions can be established in a photosensitive inorganic layer described herein by doping. In some embodiments, for example, one region of a photosensitive inorganic layer is doped with a p-dopant and another region of the photosensitive inorganic layer is doped with an n-dopant to provide a heterojunction. In some embodiments when a material of the photosensitive inorganic layer is intrinsically p-type, a region of the photosensitive inorganic layer can be doped with an n-dopant to provide a heterojunction. In some embodiments, wherein a material of the photosensitive inorganic layer is intrinsically n-type, a region of the photosensitive inorganic layer can be doped with a p-dopant to provide a heterojunction.

In some embodiments, any of the inorganic materials described herein for a photosensitive layer suitable for doping are doped to establish one or more heterojunctions in the photosensitive layer. In some embodiments, for example, hydrogen passivated amorphous silicon is doped with p-type and/or n-type dopant to establish one or more heterojunctions. Moreover, in some embodiments, group IV, group III/V and/or group II/VI semiconductor materials of inorganic photosensitive layers described herein can be doped with p-type and/or n-type dopant to provide one or more heterojunctions.

In some embodiments, an optoelectronic device described herein comprises at least one photosensitive inorganic layer comprising an n-type region, an intrinsic region, and a p-type region. In some embodiments, an n-type region is composed of an n-doped inorganic semiconductor. In some embodiments, a p-type region is composed of a p-doped inorganic semiconductor. In some embodiments, an intrinsic region is composed of an undoped inorganic semiconductor.

In some embodiments, optoelectronic devices described herein comprise multi-junction constructions. In some embodiments, an optoelectronic device described herein comprises a plurality of photosensitive inorganic layers, each layer comprising an n-type region, an intrinsic region, and a p-type region. In some embodiments, an optoelectronic device described herein comprises two photosensitive inorganic layers, each layer comprising an n-type region, an intrinsic region, and a p-type region, thereby providing a double junction device. In some embodiments, an optoelectronic device described herein comprises three photosensitive inorganic layers, each layer comprising an n-type region, an intrinsic region, and a p-type region, thereby providing a triple junction device. In some embodiments comprising a plurality of photosensitive inorganic layers each comprising an n-type region, an intrinsic region, and a p-type region, the plurality of inorganic layers are adjacent to one another, such that one or more heterojunctions are formed between the inorganic layers. In some embodiments, for example, an optoelectronic device described herein comprises a first photosensitive inorganic layer comprising a first n-type region, a first intrinsic region, and a first p-type region; and a second photosensitive inorganic layer comprising a second n-type region, a second intrinsic region, and a second p-type region, wherein the first p-type region is adjacent to the second n-type region or the first n-type region is adjacent to the second p-type region. In some embodiments, an optoelectronic device described herein comprises a single junction device. As known to one of skill in the art, tunneling junctions, in some embodiments, can be disposed between first, second and/or third photosensitive inorganic layers in the construction of a multi junction device described herein.

In some embodiments, an optoelectronic device described herein comprises a double junction device. In some embodiments, an optoelectronic device described herein comprises a triple junction device having various other constructions.

In some embodiments of optoelectronic devices described herein comprising a plurality of photosensitive inorganic layers, each photosensitive inorganic layer can independently comprise any photosensitive inorganic layer described herein. In some embodiments, the absorption profiles of the plurality of photosensitive layers do not substantially overlap. In some embodiments, the absorption profiles of the plurality of photosensitive layers at least partially overlap. In some embodiments, a plurality of photosensitive layers can be used in an optoelectronic device to capture one or more regions of the solar spectrum.

Optoelectronic devices described herein also comprise a second electrode surrounding the photosensitive inorganic layer. The second electrode, in some embodiments, is non-radiation transmissive. In some embodiments, any optoelectronic or photovoltaic device described here can comprise a non-radiation transmissive second electrode. In some embodiments, the second electrode can comprise a metal. As used herein, metal refers to both elementally pure metal (e.g., gold) and also metal alloy (e.g., materials composed of two or more elementally pure metals). In some embodiments, the second electrode comprises one or more of gold, silver, aluminum, and copper. The second electrode, in some embodiments, can have a thickness ranging from about 10 nm to about 10 µm. In other embodiments, the second electrode can have a thickness ranging from about 100 nm to about 1 µm. In some embodiments, the second electrode can have a thickness ranging from about 200 nm to about 800 nm.

Moreover, in some embodiments, the second electrode is reflective and operable to reflect at least a portion of radiation not absorbed by the photosensitive layer back into the photosensitive layer for additional opportunities for absorption.

Optoelectronic devices described herein, in some embodiments, can further comprise a protective layer surrounding the second electrode. The protective layer, in some embodiments, can provide increased durability of the device, thereby permitting use of an optoelectronic device described herein in a wide variety of applications, including photovoltaic applications. In some embodiments, the protective layer comprises a polymeric composite material. In some embodiments, the protective layer comprises nanoparticles dispersed in poly(vinylidene chloride). Nanoparticles dispersed in poly(vinylidene chloride), in some embodiments, can comprise single-walled carbon nanotubes, multi-walled carbon nanotubes, fullerenes, or mixtures thereof.

Optoelectronic devices described herein, in some embodiments, can further comprise an external metallic contact. In some embodiments, the external metallic contact surrounds the second electrode and is in electrical communication with the second electrode. The external metallic contact, in some embodiments, can be operable to extract current over at least a portion of the circumference and length of the fiber optoelectronic device. In some embodiments, the external metal contact can be operable to extract current over the entire length and circumference of the fiber optoelectronic device. The external metallic contact, in some embodiments, can comprise metals including gold, silver, or copper. In some embodiments, the external metal contact is non-radiation transmissive and/or operable to reflect non-absorbed electromagnetic radiation back into at least one photosensitive inorganic layer for further absorption. In some embodiments, an external metal contact is used in conjunction with a radiation-transmissive or non-radiation transmissive second electrode to confine light within the fiber.

In some embodiments, the external metal contact is non-radiation transmissive. In some embodiments, the external metal contact is reflective and operable to reflect at least a portion of radiation not absorbed by the photosensitive layer back into the photosensitive layer for additional opportunities for absorption.

Optoelectronic devices described herein, in some embodiments, can further comprise one or more charge transfer layers. Charge transfer layers, as used herein, refer to layers which only deliver charge carriers from one section of an optoelectronic device to another section. A charge transfer layer, in some embodiments, can be disposed between a photosensitive inorganic layer and the radiation transmissive first electrode and/or between a photosensitive inorganic layer and the second electrode. In other embodiments, charge transfer layers may be disposed between the second electrode and the protective layer of an optoelectronic device. Charge transfer layers, in some embodiments, are not photoactive.

FIG. 1 illustrates a cut away view of an optoelectronic device having a fiber structure according to one embodiment described herein. The optoelectronic device (100) shown in FIG. 1 comprises an optical fiber core (102). As discussed herein, the fiber core (102) can comprise a glass optical fiber, a quartz optical fiber, or a plastic optical fiber.

The optical fiber core (102) is radially surrounded by a radiation transmissive first electrode (104). The radiation transmissive first electrode (104) can comprise a radiation transmissive conducting oxide such as indium tin oxide, gallium indium tin oxide, or zinc indium tin oxide.

The radiation transmissive first electrode (104) is surrounded by a photosensitive inorganic layer (106). In some embodiments, the photosensitive inorganic layer (106) comprises an inorganic material such as amorphous silicon having any of the properties recited herein for amorphous silicon. The photosensitive layer (106), in some embodiments, can be in direct electrical communication with the radiation transmissive first electrode (104). In other embodiments, a charge transfer layer (not shown) may be disposed between the radiation transmissive first electrode (104) and the photosensitive layer (106) to provide indirect electrical communication between the radiation transmissive first electrode (104) and the photosensitive layer (106).

The photosensitive layer (106) is surrounded by a non-radiation transmissive second electrode (108). The photosensitive layer (106), in some embodiments, can be in direct electrical communication with the second electrode (108). In other embodiments, a charge transfer layer (not shown) may be disposed between the photosensitive layer (106) and the second electrode (108) to provide indirect electrical communication between the photosensitive layer (106) and the second electrode (108). In some embodiments, the second electrode (108) comprises a metal, such as aluminum, gold, silver, nickel, or copper.

The second electrode (108) is surrounded by a protective layer (110) comprising a polymeric composite material. In some embodiments, the polymeric composite material of the protective layer comprises carbon nanoparticles dispersed in poly(vinylidene chloride) and/or copolymers thereof The carbon nanoparticles, in some embodiments, can comprise single-walled carbon nanotubes, multi-walled carbon nanotubes, fullerenes, or mixtures thereof.

The protective layer (110) is surrounded by an external metallic contact (112) operable to extract current over a length and circumference of the fiber optoelectronic device. In some embodiments, the external metallic contact (112) can comprise metals including gold, silver, or copper.

Figure 2:
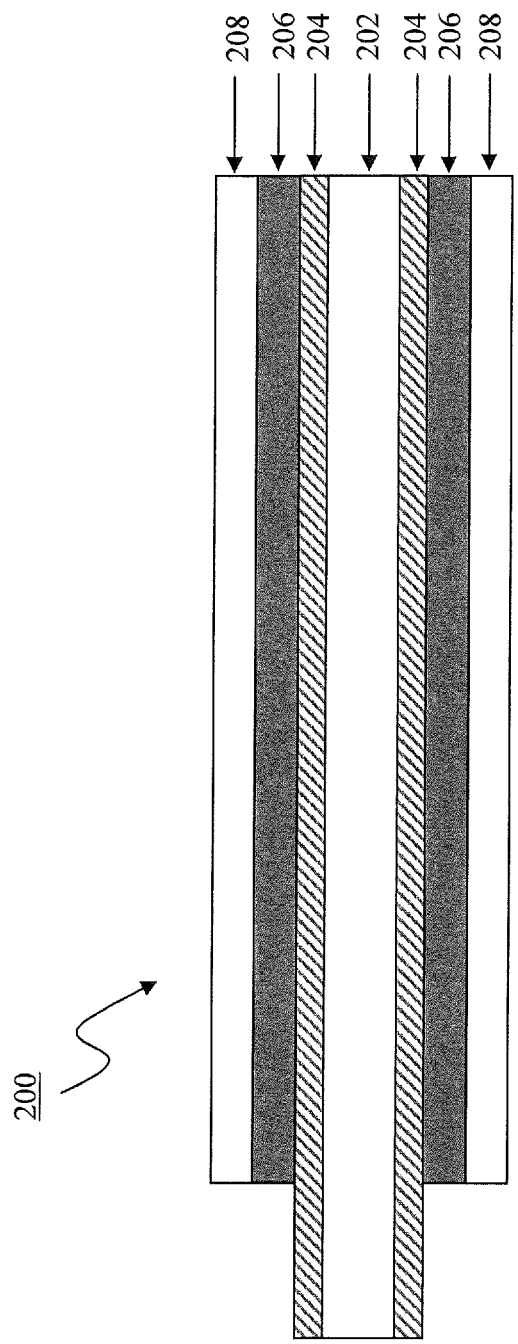
FIG. 2 illustrates a cross sectional view of an optoelectronic device comprising a fiber structure according to one embodiment described herein.

FIG. 2 illustrates a cross sectional view of an optoelectronic device comprising a fiber structure according to another embodiment described herein. The optoelectronic device (200) displayed in FIG. 2 comprises an optical fiber core (202) and a radiation transmissive first electrode (204) surrounding the optical fiber core (202). A photosensitive layer (206) surrounds the radiation transmissive first electrode (204). A non-radiation transmissive second electrode (208) surrounds the photosensitive layer (206). The compositions of the optical fiber core (202) and surrounding layers (204-208) are consistent with those provided in the various embodiments described herein.

In the embodiment shown in FIG. 2, the optical fiber core (202) and radiation transmissive first electrode (204) extend longitudinally beyond the remaining layers of the optoelectronic device (200). The longitudinal extension of the optical fiber core (202) and radiation transmissive first electrode (204), in some embodiments, can facilitate attachment of the optoelectronic device (200) to an external electrical circuit.

Figure 3:
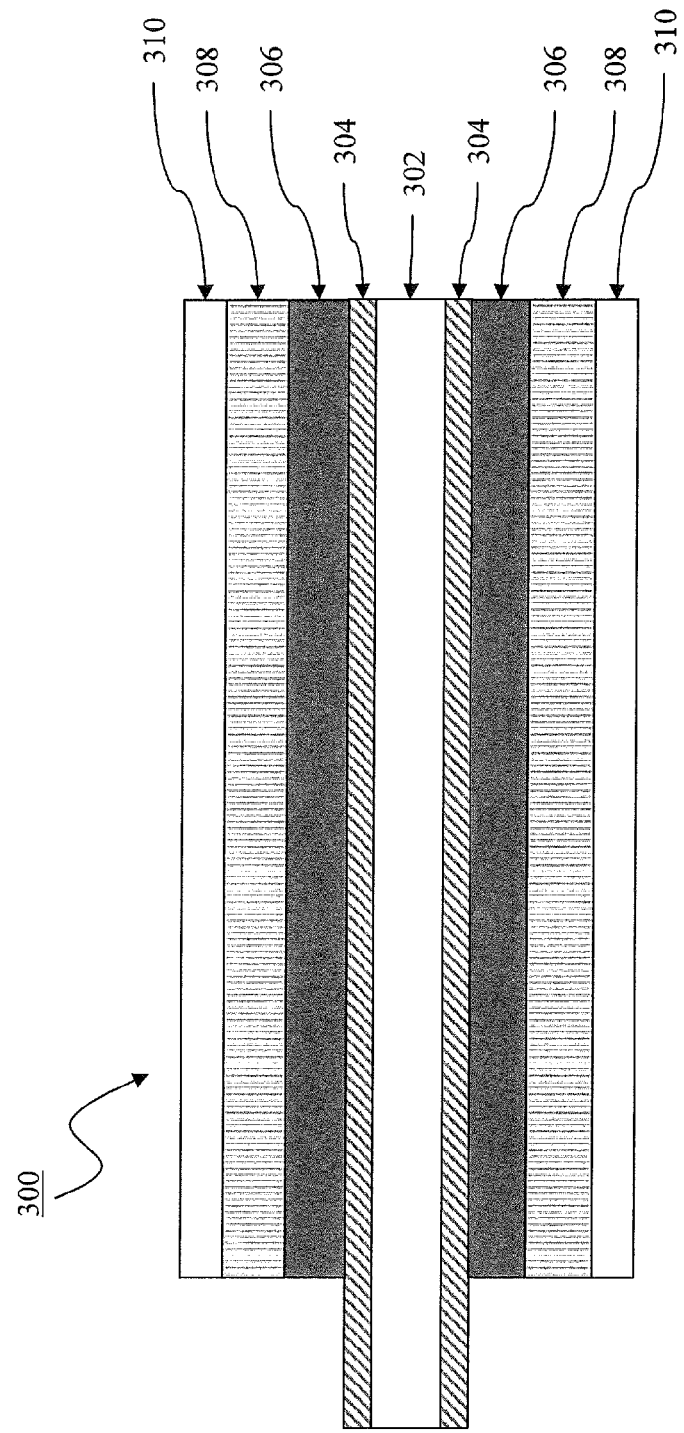
FIG. 3 illustrates a cross sectional view of an optoelectronic device comprising a fiber structure according to one embodiment described herein.

FIG. 3 illustrates a cross sectional view of an optoelectronic device comprising a fiber structure according to another embodiment described herein, wherein the optoelectronic device comprises a plurality of photosensitive layers. The optoelectronic device (300) comprises an optical fiber core (302). The fiber core (302) can comprise a glass optical fiber, a quartz optical fiber, or a plastic optical fiber.

The optical fiber core (302) is surrounded by a radiation transmissive first electrode (304). The radiation transmissive first electrode (304) can comprise a radiation transmissive conducting oxide such as indium tin oxide, gallium indium tin oxide, or zinc indium tin oxide.

The radiation transmissive first electrode (304) is surrounded by a first photosensitive layer (306). The first photosensitive layer (306) comprises an inorganic composition described herein, such as CZTS or a-Si.

The first photosensitive layer (306) is surrounded by a second photosensitive layer (308). In some embodiments, the second photosensitive layer (308) can comprise an inorganic material described herein having an electromagnetic radiation absorption profile that does not overlap or minimally overlaps that of the first photosensitive layer (306). Alternatively, the second photosensitive layer (308), in some embodiments, can comprise an inorganic material described herein having an electromagnetic radiation absorption profile that largely overlaps that of the first photosensitive layer (306).

The second photosensitive layer (308) is surrounded by a non-radiation transmissive second electrode (310) that can reflect electromagnetic radiation not absorbed by the photosensitive inorganic layers (306, 308) back into the layers (306, 308) for absorption. The second electrode (310), in some embodiments, comprises a metal, such as aluminum, gold, silver, nickel, or copper.

In the embodiment shown in FIG. 3, the optical fiber core (302) and radiation transmissive first electrode (304) extend longitudinally beyond the remaining layers of the optoelectronic device. The longitudinal extension of the optical fiber core (302) and radiation transmissive first electrode (304) can facilitate attachment of the optoelectronic device (300) to an external electrical circuit.

Although FIG. 3 illustrates an optoelectronic device having two photosensitive layers, some embodiments described herein contemplate optoelectronic devices comprising more than two photosensitive layers, including optoelectronic devices having three, four, five, and greater than five photosensitive inorganic layers. By providing a plurality of photosensitive layers wherein each layer has a distinct absorption profile, optoelectronic devices described herein can increase or maximize exciton generation across the electromagnetic spectrum.

In some embodiments, an optoelectronic device comprises a fiber core having a plurality of photosensitive regions located along its longitudinal axis, each of the plurality of photosensitive regions comprising a radiation transmissive first electrode surrounding the fiber core, at least one photosensitive inorganic layer surrounding the first electrode and electrically connected to the first electrode, and a second electrode surrounding the photosensitive inorganic layer and electrically connected to the photosensitive inorganic layer. Each of the plurality of regions may further comprise additional layers as set forth herein, including additional photosensitive inorganic layers as provided in FIG. 3.

Figure 4:
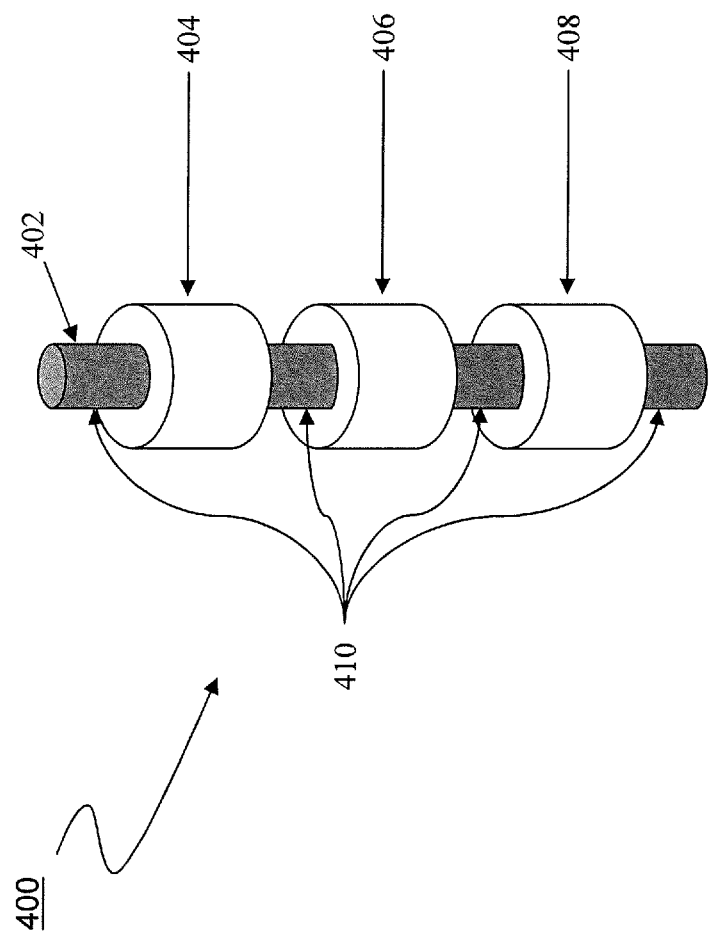
FIG. 4 illustrates an optoelectronic device comprising a fiber structure according to one embodiment described herein.

FIG. 4 illustrates an optoelectronic device (400) comprising a fiber core (402) having a plurality of photosensitive regions (404, 406, 408) disposed along its longitudinal axis. In some embodiments, the photosensitive layer or layers of each region (404, 406, 408) can be chosen to have a distinct electromagnetic radiation absorption profile that does not overlap or minimally overlaps with the absorption profiles of the other regions. In the present embodiment, for example, the photosensitive layer of region 404 can have an absorption profile ranging from about 400 nm to about 600 nm, while the photosensitive layer of region 406 can have an absorption profile ranging from about 600 nm to about 800 nm. The photosensitive layer of region 408, in the present embodiment, can have an absorption profile ranging from about 800 nm to about 1100 nm.

By providing a plurality of photosensitive regions wherein each region comprises at least one photosensitive inorganic layer having a distinct absorption profile, optoelectronic devices described herein can increase or maximize exciton generation across the electromagnetic spectrum.

Further, in some embodiments, the fiber core of an optoelectronic device described herein comprising a plurality of photosensitive regions can be partially coated with a non-radiation transmissive material that prevents electromagnetic radiation propagating along the longitudinal axis of the fiber from escaping the fiber. Suitable coating materials, in some embodiments, can comprise metal cladding or any other material that promotes internal reflection. As shown in FIG. 4, the optical fiber core (402) can be coated with metal cladding (410) between the photosensitive regions (404, 406, 408). In the present embodiment, the optical fiber core is not coated with metal cladding or other non-radiation transmissive material in the photosensitive regions. Therefore, electromagnetic radiation propagating along the longitudinal axis of the fiber can be coupled into the photosensitive regions (404, 406, 408).

By providing a plurality of photosensitive regions located along the longitudinal axis of the fiber core, optoelectronic devices described herein can permit the coupling of electromagnetic radiation into the photosensitive regions without substantial loss, such as loss caused by reflection at one or more junctions or layer interfaces, as is common with stacked multi junction devices. For example, in some embodiments the coupling can occur without substantial loss across the junction of the fiber core and the radiation transmissive first electrode and/or the junction of the radiation transmissive first electrode and the photosensitive inorganic layers of the photosensitive regions. Moreover, in some embodiments, the coupling can occur without substantial loss across junctions between photosensitive layers having distinct absorption profiles, in contrast to some devices employing stacked or layered photosensitive regions, as in multi junction devices.

In addition, optoelectronic devices described herein comprising a fiber core having a plurality of photosensitive regions located along its longitudinal axis can be manufactured more easily than other devices having multispectral capabilities, such as devices having stacked or layered photosensitive regions having distinct absorption profiles. For example, in some embodiments, optoelectronic devices described herein can be manufactured using standard lithographic techniques. Such techniques can include, for instance, chemical vapor deposition (CVD) and masking techniques.

Figure 5:
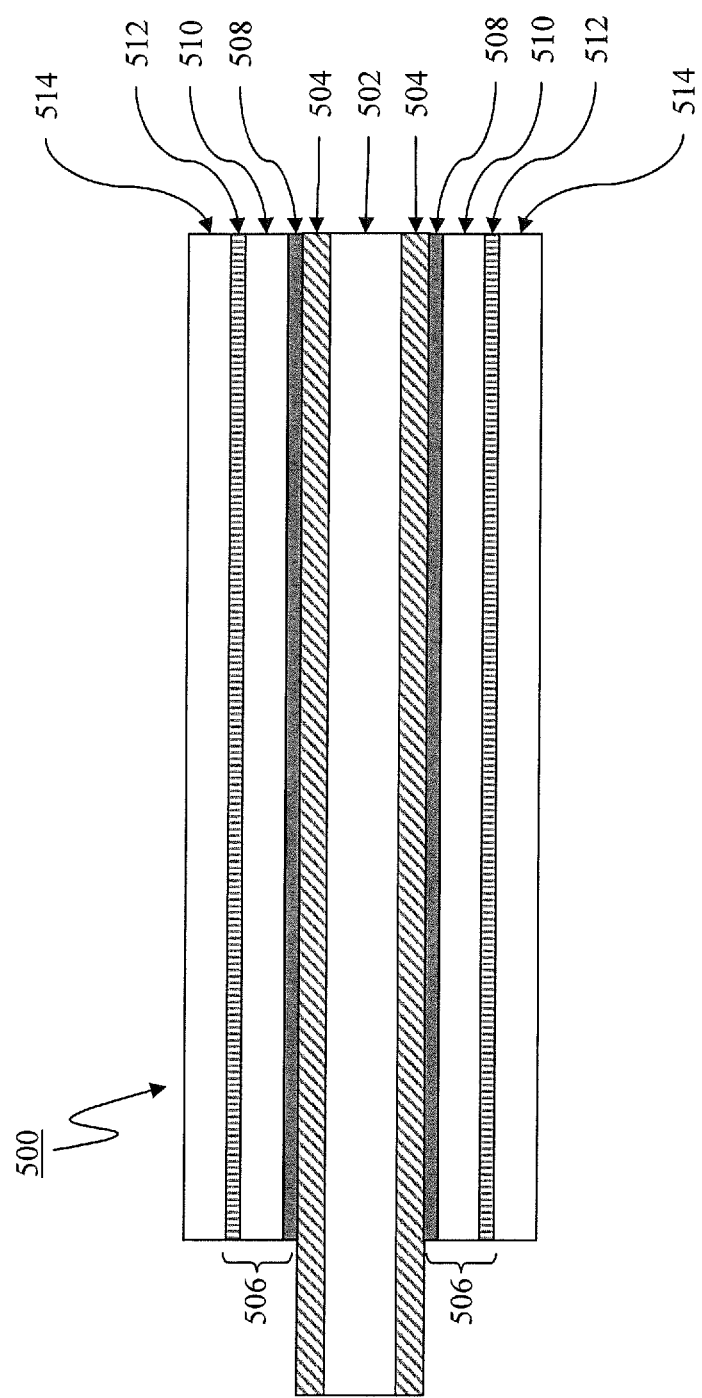
FIG. 5 illustrates a cross sectional view of an optoelectronic device comprising a fiber structure according to one embodiment described herein.

FIG. 5 illustrates a cross sectional view of an optoelectronic device comprising a fiber structure according to another embodiment described herein. The optoelectronic device (500)) displayed in FIG. 5 comprises an optical fiber core (502) and a radiation transmissive first electrode (504) surrounding the optical fiber core (502). A photosensitive inorganic layer (506) surrounds the transmissive first electrode (504). The photosensitive inorganic layer (506) includes n-type region (512), intrinsic region (510), and p-type region (508). In some embodiments, the photosensitive inorganic layer (506) can comprise an inorganic composition, such as amorphous silicon having a structure described herein, which can be doped with a first, n-type dopant to provide n-type region (512) and a second, p-type dopant to provide p-type region (508). The intrinsic region (510), in some embodiments, can comprise the undoped inorganic composition, such as undoped amorphous silicon. A non-radiation transmissive second electrode (514) surrounds the photosensitive layer (506).

In the embodiment shown in FIG. 5, the optical fiber core (502) and radiation transmissive first electrode (504) extend longitudinally beyond the remaining layers of the optoelectronic device (500). The longitudinal extension of the optical fiber core (502) and radiation transmissive first electrode (504), in some embodiments, can facilitate attachment of the optoelectronic device (500)) to an external electrical circuit.

Figure 6:
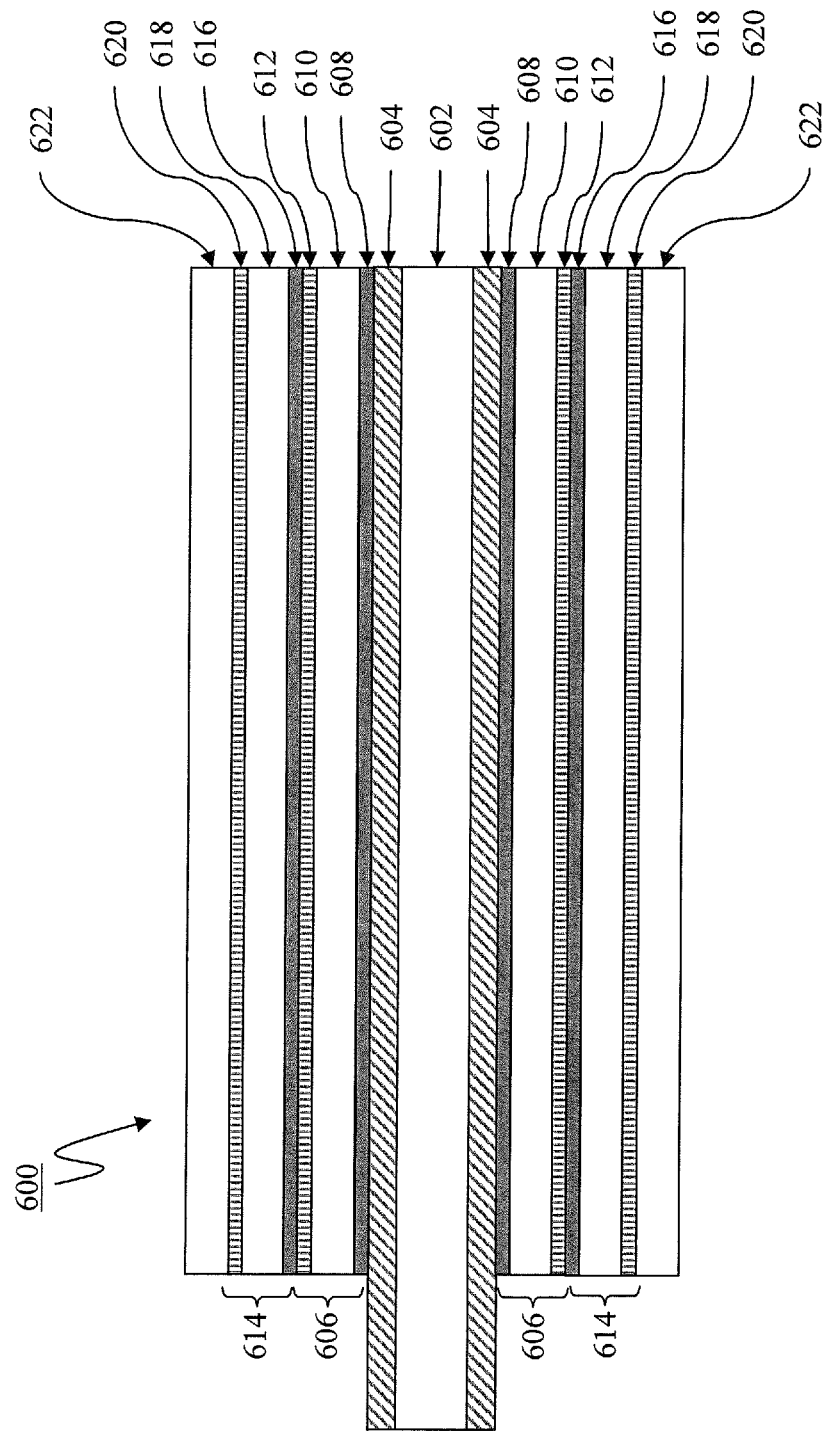
FIG. 6 illustrates a cross sectional view of an optoelectronic device comprising a fiber structure according to one embodiment described herein.

FIG. 6 illustrates a cross sectional view of an optoelectronic device comprising a fiber structure according to another embodiment described herein. The optoelectronic device (600) displayed in FIG. 6 comprises an optical fiber core (602) and a radiation transmissive first electrode (604) surrounding the optical fiber core (602). A first photosensitive inorganic layer (606) surrounds the transmissive first electrode (604). The first photosensitive inorganic layer (606) includes first n-type region (612), first intrinsic region (610), and first p-type region (608). In some embodiments, the first photosensitive inorganic layer (606) can comprise an inorganic composition, such as amorphous silicon having a structure described herein, which can be doped with a first, n-type dopant to provide the first n-type region (612) and a second, p-type dopant to provide the first p-type region (608). The first intrinsic region (610), in some embodiments, can comprise the undoped inorganic composition, such as undoped amorphous silicon. In the present embodiment, a second photosensitive inorganic layer (614) surrounds the first photosensitive inorganic layer (606). The second photosensitive inorganic layer (614) includes second n-type region (620), second intrinsic region (618), and second p-type region (616). In some embodiments, the second photosensitive inorganic layer (614) can comprise an inorganic composition, such as amorphous silicon having a structure described herein, which can be doped with an n-type dopant to provide the second n-type region (620) and a p-type dopant to provide the second p-type region (616). The second intrinsic region (618), in some embodiments, can comprise the undoped inorganic composition, such as undoped amorphous silicon. A non-radiation transmissive second electrode (622) surrounds the second photosensitive inorganic layer (614). In some embodiments, a tunneling junction (not shown) is disposed between the first photosensitive inorganic layer (606) and the second photosensitive inorganic layer (614).

In the embodiment shown in FIG. 6, the optical fiber core (602) and radiation transmissive first electrode (604) extend longitudinally beyond the remaining layers of the optoelectronic device (600). The longitudinal extension of the optical fiber core (602) and radiation transmissive first electrode (604), in some embodiments, can facilitate attachment of the optoelectronic device (600) to an external electrical circuit.

Figure 7:
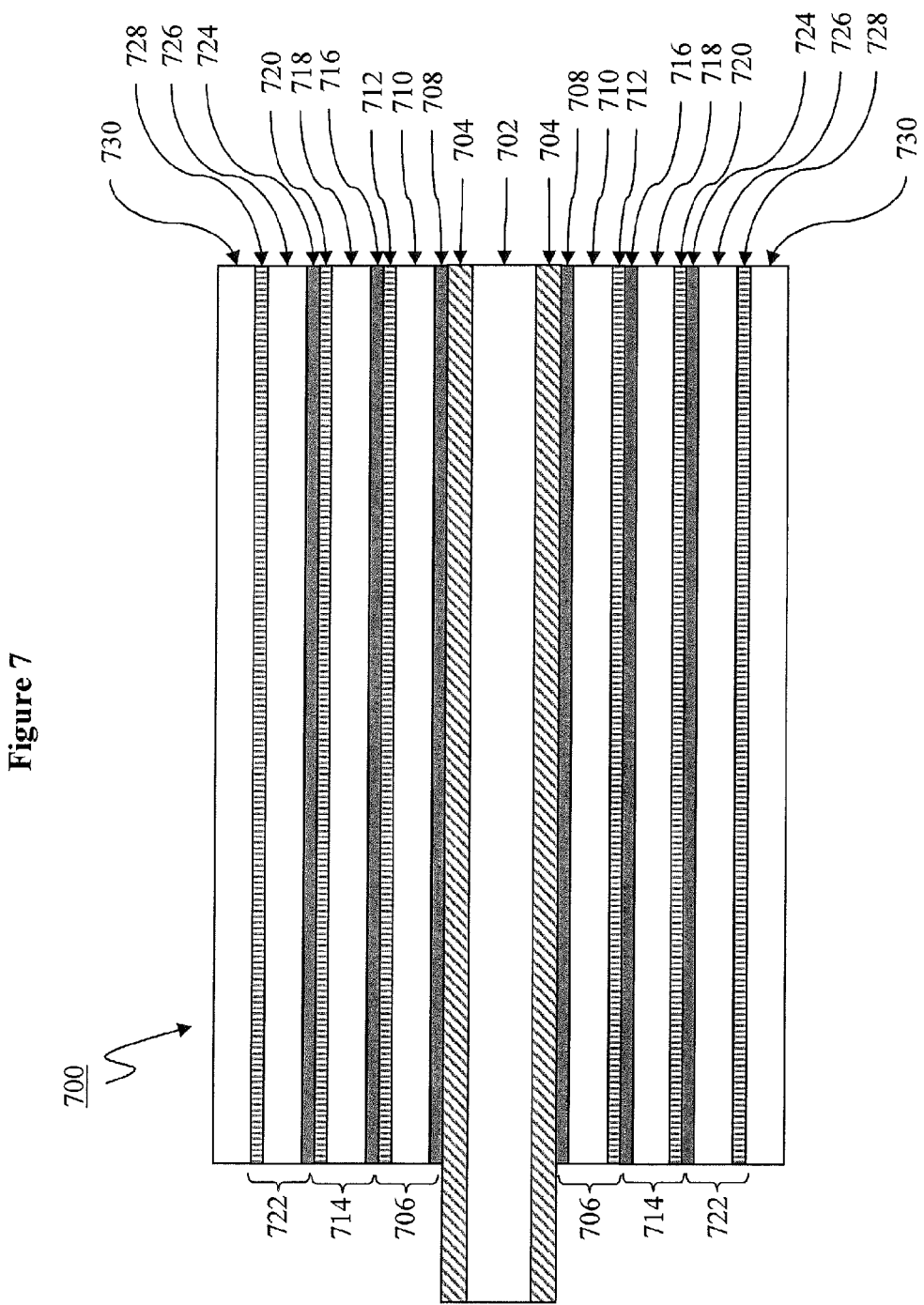
FIG. 7 illustrates a cross sectional view of an optoelectronic device comprising a fiber structure according to one embodiment described herein.

FIG. 7 illustrates a cross sectional view of an optoelectronic device comprising a fiber structure according to another embodiment described herein. The optoelectronic device (700) displayed in FIG. 7 comprises an optical fiber core (702) and a radiation transmissive first electrode (704) surrounding the optical fiber core (702). A first photosensitive inorganic layer (706) surrounds the radiation transmissive first electrode (704). The first photosensitive inorganic layer (706) includes a first n-type region (712), a first intrinsic region (710), and a first p-type region (708). In some embodiments, the first photosensitive inorganic layer (706) can comprise an inorganic composition described herein, such as amorphous silicon, which can be doped with a first, n-type dopant to provide the first n-type region (712) and a second, p-type dopant to provide the first p-type region (708). The first intrinsic region (710), in some embodiments, can comprise the undoped inorganic composition, such as undoped amorphous silicon. In the present embodiment, a second photosensitive inorganic layer (714) surrounds the first photosensitive inorganic layer (706). The second photosensitive inorganic layer (714) includes a second n-type region (720), a second intrinsic region (718), and a second p-type region (716). In some embodiments, the second photosensitive inorganic layer (714) can comprise an inorganic composition described herein, such as amorphous silicon, which can be doped with an n-type dopant to provide the second n-type region (720) and a p-type dopant to provide the second p-type region (716). The second intrinsic region (718), in some embodiments, can comprise the undoped inorganic composition, such as undoped amorphous silicon. A third photosensitive inorganic layer (722) surrounds the second photosensitive inorganic layer (714). The third photosensitive inorganic layer (722) includes a third n-type region (728), a third intrinsic region (726), and a third p-type region (724). In some embodiments, the third photosensitive inorganic layer (722) can comprise an inorganic composition, such as amorphous silicon, which can be doped with an n-type dopant to provide the third n-type region (728) and a p-type dopant to provide the third p-type region (724). The third intrinsic region (726), in some embodiments, can comprise the undoped inorganic composition, such as undoped amorphous silicon. A non-radiation transmissive second electrode (730) surrounds the third photosensitive inorganic layer (722).

In the embodiment shown in FIG. 7, the optical fiber core (702) and radiation transmissive first electrode (704) extend longitudinally beyond the remaining layers of the optoelectronic device (700). The longitudinal extension of the optical fiber core (702) and radiation transmissive first electrode (704), in some embodiments, can facilitate attachment of the optoelectronic device (700) to an external electrical circuit.

In some embodiments, optoelectronic devices having any of the constructions described herein are photovoltaic cells. Photovoltaic cells described herein, in some embodiments, are operable to receive electromagnetic radiation along the longitudinal axis of the fiber core. Electromagnetic radiation received along the longitudinal axis of the fiber core, in some embodiments, can be transmitted though the radiation transmissive first electrode and into the photosensitive inorganic layer through evanescence fields. In some embodiments, the received electromagnetic radiation can be scattered into the photosensitive inorganic layer by scattering agents within the fiber core. In some embodiments, at least a portion of the received electromagnetic radiation can undergo upconversion or downconversion and be emitted into the photosensitive inorganic layer.

Photovoltaic cells described herein, in some embodiments, have a conversion efficiency of at least about 3%. In some embodiments, a photovoltaic cell has a conversion efficiency of at least about 5% or at least about 10%. In some embodiments, a photovoltaic cell described herein has a conversion efficiency ranging from about 5% to about 15% or from about 7% to about 12%. In some embodiments, a photovoltaic cell described herein has a conversion efficiency ranging from about 10% to about 30% or ranging from about 10% to about 20%.

Photovoltaic cells having constructions described herein, in some embodiments, can display various fill factors. In some embodiments, a photovoltaic cell described herein has a fill factor of at least about 0.2 or at least about 0.4. In some embodiments, a photovoltaic cell described herein has a fill factor or at least about 0.5 or at least about 0.7.

Photovoltaic cells described herein, in some embodiments, do not exhibit a significant degradation of efficiency during the lifetime of the device. In some embodiments, a photovoltaic cell described herein can maintain a conversion efficiency between about 8% and about 15% over the lifetime of the device. In some embodiments, a photovoltaic cell described herein can maintain a conversion efficiency between about 10% and about 15% over the lifetime of the device. In some embodiments, the lifetime of the device comprises up to about 25 years of normal use.

In some embodiments wherein a photovoltaic cell comprises an amorphous silicon photosensitive inorganic layer described herein, the photovoltaic cell displays less than a 15% reduction in initial conversion efficiency resulting from the Staebler-Wronski effect. In some embodiments, a photovoltaic cell described herein comprising an amorphous silicon layer displays less than a 10% or less than a 5% reduction in initial conversion efficiency resulting from the Staebler-Wronski effect. In some embodiments, a photovoltaic cell described herein comprising an amorphous silicon layer displays less than a 3% or less than a 2% reduction in initial conversion efficiency resulting from the Staebler-Wronski effect. In some embodiments, the amorphous silicon demonstrating any of the foregoing reductions in conversion efficiency resulting from the Staebler-Wronski effect is hydrogen passivated amorphous silicon (a-Si:H).

In some embodiments, a photovoltaic cell described herein is operable to capture up to about 70% of the incident luminous flux. Additionally, in some embodiments, the illuminance of the at least one photosensitive inorganic layer is less than or equal to the illuminance at an end of the fiber core divided by the aspect ratio of the fiber core.

Photovoltaic cells described herein, in some embodiments, can comprise any radiation transmissive first electrode, photosensitive inorganic layer and second electrode of any construction described herein. In one non-limiting embodiment, for example, a photovoltaic cell comprises an optical fiber core, a radiation transmissive first electrode surrounding the optical fiber core, an amorphous silicon layer having a thickness selected from Table I hereinabove surrounding the first electrode and electrically connected to the first electrode and a second electrode surrounding the amorphous silicon layer and electrically connected to the amorphous silicon layer, wherein the photovoltaic device has a conversion efficiency of at least 5%. In some embodiments, the photovoltaic cell has a conversion efficiency of at ranging from about 5% to about 20% or from about 7% to about 15%.

In another non-limiting embodiment, a photovoltaic cell comprises an optical fiber core, a radiation transmissive first electrode surrounding the optical fiber core, hydrogen passivated amorphous silicon photosensitive layer surrounding the first electrode and electrically connected to the first electrode and a second electrode surrounding the photosensitive amorphous silicon layer and electrically connected to the amorphous silicon layer, wherein the photovoltaic cell displays less than a 15%, less than a 10% or less than a 5% reduction in initial conversion efficiency resulting from the Staebler-Wronski effect. In some embodiments, the amorphous silicon layer does not comprise or does not comprise or does not substantially comprise halogenated amorphous silicon such as fluorinated amorphous silicon (a-Si:F). Moreover, in some embodiments, the hydrogen passivated amorphous silicon layer has a thickness selected from Table I hereinabove.

In another non-limiting embodiment, a photovoltaic cell comprises a fiber core, a radiation transmissive first electrode surrounding the fiber core, at least one photosensitive inorganic layer surrounding the first electrode and electrically connected to the first electrode, and a second electrode surrounding the inorganic layer and electrically connected to the inorganic layer, wherein the at least one photosensitive inorganic layer comprises nanocrystalline silicon having a grain size less than about 100 nm and the device has a conversion efficiency of at least about 3%. In some embodiments, the at least one photosensitive inorganic layer comprises nanocrystalline silicon having a grain size between about 10 nm and about 100 nm and the device has a conversion efficiency of at least about 10% or between about 3% and about 15%.

In another non-limiting embodiment, a photovoltaic cell comprises a fiber core, a radiation transmissive first electrode surrounding the fiber core, at least one photosensitive inorganic layer surrounding the first electrode and electrically connected to the first electrode, and a second electrode surrounding the inorganic layer and electrically connected to the inorganic layer, wherein the at least one photosensitive inorganic layer comprises polycrystalline CZTS having a grain size less than about 100 nm and the device has a conversion efficiency of at least about 3%. In some embodiments, the at least one photosensitive inorganic layer comprises polycrystalline CZTS having a grain size between about 10 nm and about 1 μm and the device has a conversion efficiency of at least about 10% or between about 3% and about 15%.

In another aspect, optoelectronic devices are provided herein comprising at least one pixel comprising at least one photovoltaic cell, the photovoltaic cell comprising a fiber core, a radiation transmissive first electrode surrounding the fiber core, at least one photosensitive inorganic layer surrounding the first electrode and electrically connected to the first electrode, and a second electrode surrounding the inorganic layer and electrically connected to the inorganic layer. In some embodiments, a photovoltaic cell of a pixel comprises a plurality of photosensitive inorganic layers as described herein. In some embodiments, a photovoltaic cell of a pixel comprises a fiber core comprising a plurality of photosensitive regions disposed along the longitudinal axis of the fiber core, each photosensitive region comprising a radiation transmissive first electrode surrounding the fiber core, at least one photosensitive inorganic layer surrounding the first electrode and electrically connected to the first electrode, and a second electrode surrounding the at least one photosensitive inorganic layer and electrically connected to the photosensitive layer.

In some embodiments, the at least one pixel comprises a plurality of photovoltaic cells. In some embodiments, an optoelectronic device comprises a plurality of pixels. In some embodiments, the device comprises an array of pixels. In some embodiments comprising an array of pixels, each pixel comprises a plurality of photovoltaic cells. Photovoltaic cells of pixels, in some embodiments, can have any construction and/or properties of photovoltaic cells described herein.

Optoelectronic devices described herein, in some embodiments, can capture a high percentage of the luminous flux incident on the device. In some embodiments of optoelectronic devices comprising at least one pixel described herein, a device is operable to capture up to about 50% of the incident luminous flux, such as the incident luminous flux provided by the sun. In some embodiments, the device is operable to capture up to about 70% of the incident luminous flux. In some embodiments, the device is operable to capture up to about 80% of the incident luminous flux. As used herein, capturing light includes receiving light into one or more fiber cores of a device.

In some embodiments, fiber optoelectronic devices described herein, including photovoltaic cells, are operable not only to capture a high percentage of incident luminous flux, but also to reduce the illuminance of the photosensitive layer. In some embodiments, reducing the illuminance of the photosensitive layer comprises reducing the flux per area of the photosensitive layer compared to the flux per area of a planar device receiving the same incident luminous flux. Reducing the illuminance of the photosensitive layer, in some embodiments, can increase the useful lifetime of the device. In some embodiments of optoelectronic devices described herein, the illuminance of the at least one photosensitive inorganic layer is less than or equal to the illuminance at an irradiated end of the fiber core divided by the aspect ratio of the fiber core.

Photovoltaic cells for use in pixel applications described herein, in some embodiments, are constructed independently from one another. In such embodiments, component materials for one photovoltaic cell are selected without reference to component materials selected for another photovoltaic cell. In one embodiment, for example, one photovoltaic cell can comprise a glass optical fiber core while another photovoltaic cell can comprise a plastic optical fiber core. As a result, in some embodiments, pixels and pixel arrays are not required to comprise photovoltaic cells of identical construction. Photovoltaic cell construction can be varied in any manner consistent with the materials and methods described herein to produce pixels and pixel arrays suitable for a wide range of applications.

In some embodiments, a plurality of photovoltaic cells described herein can be bundled. In some embodiments, each photovoltaic cell can constitute a single pixel. In some embodiments, the plurality of photovoltaic cells can collectively constitute a single pixel. In some embodiments, bundling photovoltaic cells described herein can increase the lifetime of the photovoltaic cells by reducing surface exposure of the photovoltaic cells to oxygen, moisture and/or other degradative species.

Pixels and pixel arrays can be placed on any suitable substrate, in some embodiments, to produce solar panels. Solar cells and panels, in some embodiments, can have conversion any efficiency and/or resistance to the Staebler-Wronski effect described herein for a photovoltaic cell.

In another aspect, tapered optoelectronic devices are described herein. In some embodiments, an optoelectronic device comprises a fiber core having a tapered end and a non-tapered end, a radiation transmissive first electrode surrounding the fiber core, at least one photosensitive inorganic layer surrounding the first electrode and electrically connected to the first electrode, and a second electrode surrounding the inorganic layer and electrically connected to the inorganic layer. Tapered optoelectronic devices described herein, in some embodiments, can comprise any radiation transmissive first electrode, photosensitive inorganic layer and second electrode of any construction described herein. In some embodiments, only the non-tapered end of the fiber core comprises a radiation transmissive first electrode surrounding the fiber core, at least one photosensitive inorganic layer surrounding the first electrode and electrically connected to the first electrode, and a second electrode surrounding the inorganic layer and electrically connected to the inorganic layer.

In some embodiments of tapered optoelectronic devices described herein, the tapered end of the fiber core comprises a funnel. Moreover, the funnel can be operable to collect electromagnetic radiation and direct it into the non-tapered end of the fiber core. Therefore, tapered optoelectronic devices described herein, in some embodiments, can collect electromagnetic radiation over a wider range of angles than non-tapered devices, increasing the amount of electromagnetic radiation provided to the photosensitive inorganic layer.

The funnel can have any size and shape not inconsistent with the objectives of the present invention. For example, in some embodiments, the funnel is conical or substantially conical. In some embodiments, the funnel forms an angle with the non-tapered end ranging from about 30 degrees to about 120 degrees. In some embodiments, the funnel forms an angle with the non-tapered end ranging from about 45 degrees to about 90 degrees. In some embodiments, the funnel forms an angle with the non-tapered end ranging from about 55 degrees to 65 degrees.

Further, the relative dimensions of the tapered and non-tapered ends of the fiber core can comprise any relative dimensions not inconsistent with the objectives of the present invention. In some embodiments, for example, the tapered end is longer and wider than the non-tapered end. In some embodiments, the ratio of the length of the tapered end to the length of the non-tapered end is at least about 2:1. In some embodiments, the ratio is at least about 3:1, 5:1, or 10:1. In some embodiments, the ratio ranges from about 3:1 to about 5:1 or from about 3:1 to about 10:1. In some embodiments, the ratio ranges from about 4:1 to about 6:1. In some embodiments, the ratio is about 1:1 or less than about 1:1.

In some embodiments, the ratio of the width or diameter of the tapered end of the fiber core at its widest point to the width or diameter of the non-tapered end is at least about 2:1. In some embodiments, the ratio is at least about 5:1 or at least about 10:1. In some embodiments, the ratio ranges from about 1:1 to about 2:1, from about 5:1 to about 20:1, or from about 5:1 to about 15:1.

Figure 8:
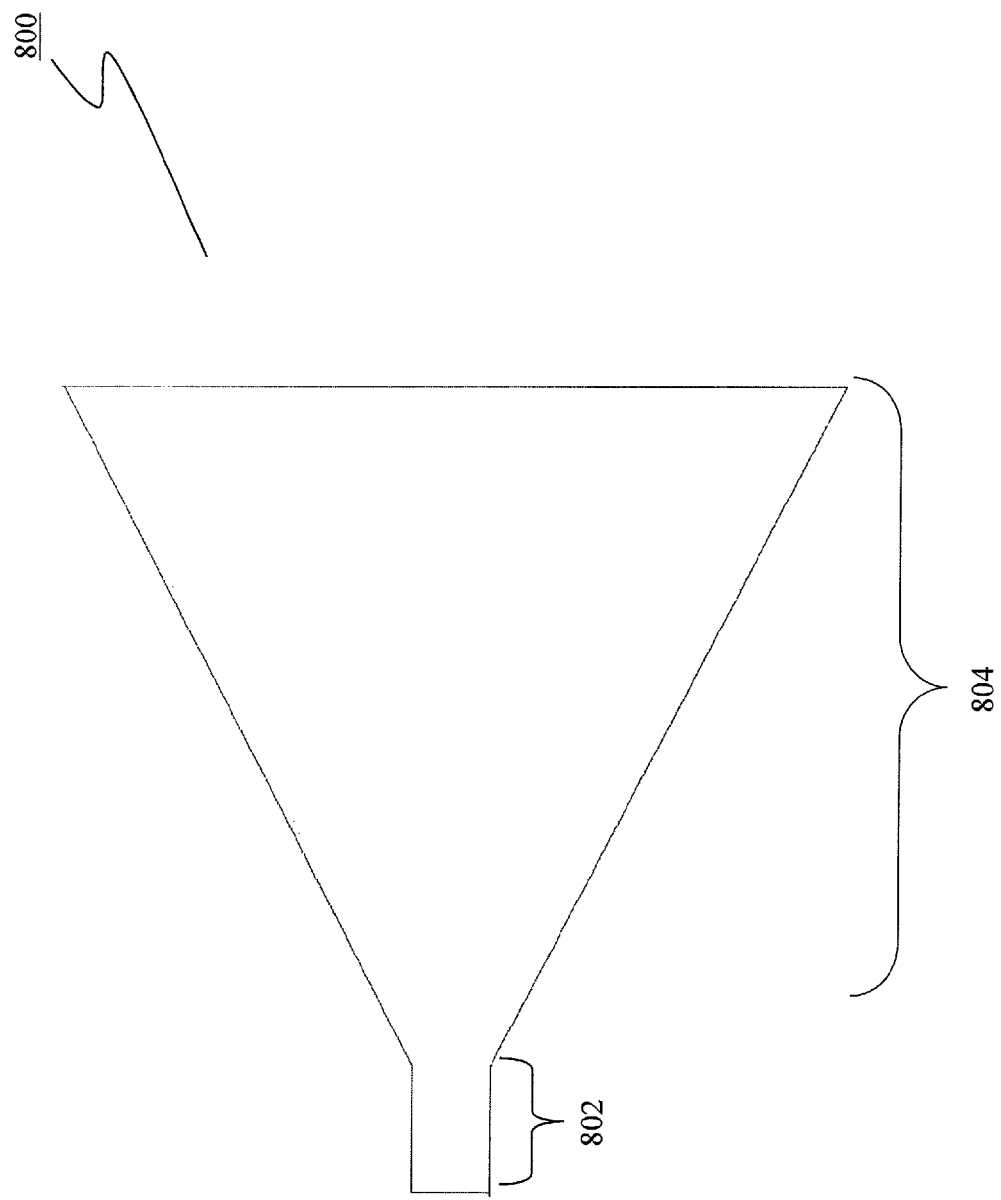
FIG. 8 illustrates a cross sectional view of a fiber core suitable for use in some embodiments of an optoelectronic device described herein.

FIG. 8 illustrates a fiber core suitable for use in one embodiment of a tapered optoelectronic device described herein. Fiber core (800) has a tapered end (804) and a non-tapered end (802). The tapered (804) and non-tapered (802) ends of the fiber core are immediately adjacent to and continuous with one another, wherein the tapered end (804) has a conical or funnel geometry.

In another aspect, multispectral tapered optoelectronic devices are described herein. In some embodiments, a multispectral tapered optoelectronic device comprises a fiber core having a tapered end, a non-tapered end, and a plurality of photosensitive regions located along the longitudinal axis of the fiber core, each of the plurality of photosensitive regions comprising a radiation transmissive first electrode surrounding the fiber core, at least one photosensitive inorganic layer surrounding the first electrode and electrically connected to the first electrode, and a second electrode surrounding the photosensitive inorganic layer and electrically connected to the photosensitive inorganic layer. Each of the plurality of regions may further comprise additional layers as set forth herein, including additional photosensitive inorganic layers. In some embodiments, the plurality of photosensitive regions are located along the longitudinal axis of the non-tapered end of the fiber core.

Figure 9:
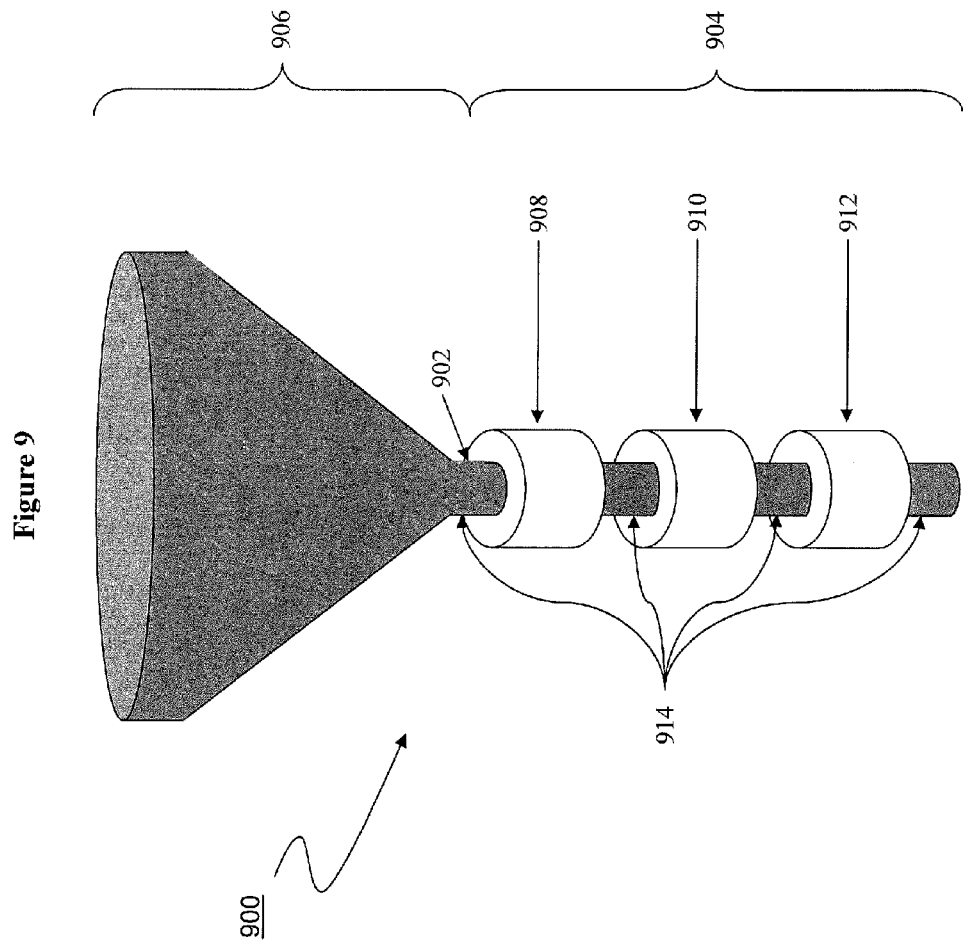
FIG. 9 illustrates an optoelectronic device comprising a fiber structure according to one embodiment described herein.

FIG. 9 illustrates an optoelectronic device (900) comprising a fiber core (902) having a tapered end (906), a non-tapered end (904), and a plurality of photosensitive regions (908, 910, 912) disposed along the longitudinal axis of the fiber core. In some embodiments, the photosensitive layer or layers of each region (908, 910, 912) can be chosen to have a distinct electromagnetic radiation absorption profile that does not overlap or minimally overlaps with the absorption profiles of the other regions. In the present embodiment, for example, the photosensitive layer of region 908 can have an absorption profile ranging from about 400 nm to about 600 nm, while the photosensitive layer of region 910 can have an absorption profile ranging from about 600 nm to about 800 nm. The photosensitive layer of region 912, in the present embodiment, can have an absorption profile ranging from about 800 nm to about 1150 nm.

By providing a plurality of photosensitive regions wherein each region comprises at least one photosensitive inorganic layer having a distinct absorption profile, optoelectronic devices described herein can increase or maximize exciton generation across the electromagnetic spectrum.

Further, in some embodiments, the fiber core of an optoelectronic device described herein comprising a plurality of photosensitive regions can be partially coated with a non-radiation transmissive material that prevents electromagnetic radiation propagating along the longitudinal axis of the fiber from escaping the fiber. Suitable coating materials, in some embodiments, can comprise metal cladding or any other material that promotes internal reflection. As shown in FIG. 9, the optical fiber core (902) can be coated with metal cladding (914) between the photosensitive regions (908, 910, 912). In the present embodiment, the optical fiber core is not coated with metal cladding or other non-radiation transmissive material in the photosensitive regions. Therefore, electromagnetic radiation propagating along the longitudinal axis of the fiber can be coupled into the photosensitive regions (908, 910, 912).

By providing a plurality of photosensitive regions located along the longitudinal axis of the fiber core, optoelectronic devices described herein can permit the coupling of electromagnetic radiation into the photosensitive regions without substantial loss, such as loss caused by reflection at one or more junctions or layer interfaces. For example, in some embodiments, the coupling can occur without substantial loss across the junction of the fiber core and the radiation transmissive first electrode and/or the junction of the radiation transmissive first electrode and the photosensitive inorganic layers of the photosensitive regions. Moreover, in some embodiments, the coupling can occur without substantial loss across junctions between photosensitive layers having distinct absorption profiles, in contrast to some devices employing stacked or layered photosensitive regions, such as multi junction devices.

In addition, optoelectronic devices described herein comprising a fiber core having a plurality of photosensitive regions located along its longitudinal axis can be manufactured more easily than other devices having multispectral capabilities, such as devices having stacked or layered photosensitive regions having distinct absorption profiles. For example, in some embodiments, optoelectronic devices described herein can be manufactured using standard lithographic techniques. Such techniques can include, for instance, chemical vapor deposition (CVD) and masking techniques.

In another aspect, optoelectronic devices are provided herein comprising at least one pixel comprising at least one photovoltaic cell, the photovoltaic cell comprising a fiber core having a tapered end and a non-tapered end, a radiation transmissive first electrode surrounding the fiber core, at least one photosensitive inorganic layer surrounding the first electrode and electrically connected to the first electrode, and a second electrode surrounding the inorganic layer and electrically connected to the inorganic layer. In some embodiments, a photovoltaic cell of a pixel comprises a plurality of photosensitive inorganic layers. The photovoltaic cell of a pixel can comprise a tapered optoelectronic device of any construction described herein.

In some embodiments, an optoelectronic device comprises a plurality of pixels. In some embodiments, the device comprises an array of pixels. In some embodiments comprising an array of pixels, each pixel comprises a photovoltaic cell comprising a fiber core having a tapered end and a non-tapered end, a radiation transmissive first electrode surrounding the fiber core, at least one photosensitive inorganic layer surrounding the first electrode and electrically connected to the first electrode, and a second electrode surrounding the inorganic layer and electrically connected to the inorganic layer. The photovoltaic cell of each pixel can comprise a tapered optoelectronic device of any construction described herein.

Figure 10:
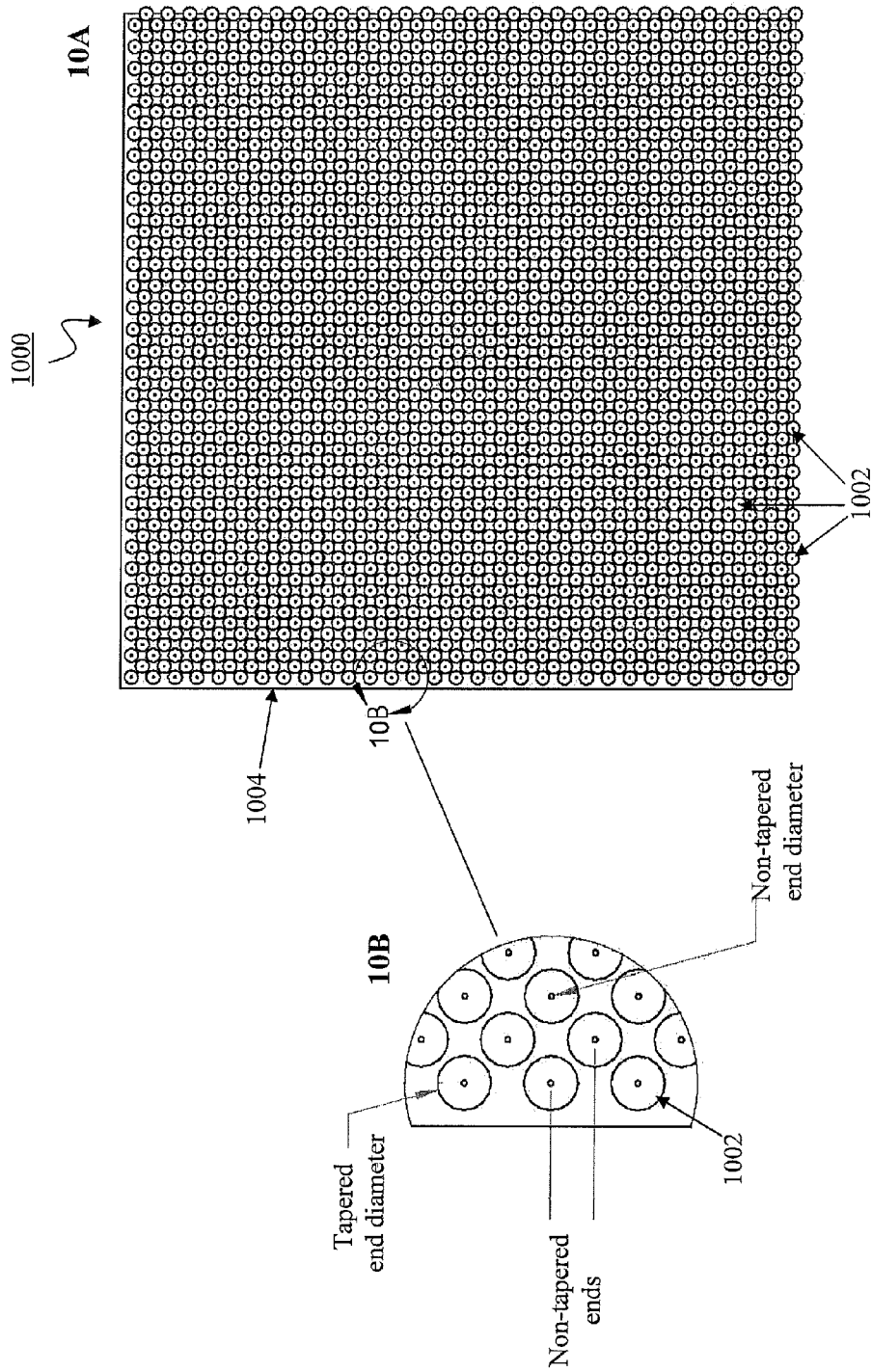
FIG. 10 illustrates a top view of an array of pixels suitable for use in some embodiments of an optoelectronic device described herein.

FIG. 10 is a top view of an array of pixels suitable for use in one embodiment of an optoelectronic device described herein. Array (1000) comprises a plurality of pixels (1002) arrayed on a substrate (1004). Each pixel (1002) comprises a photovoltaic cell comprising a tapered optoelectronic device described herein. The tapered end of each tapered optoelectronic device of each pixel comprises a funnel as illustrated in FIG. 8.

Figure 11:
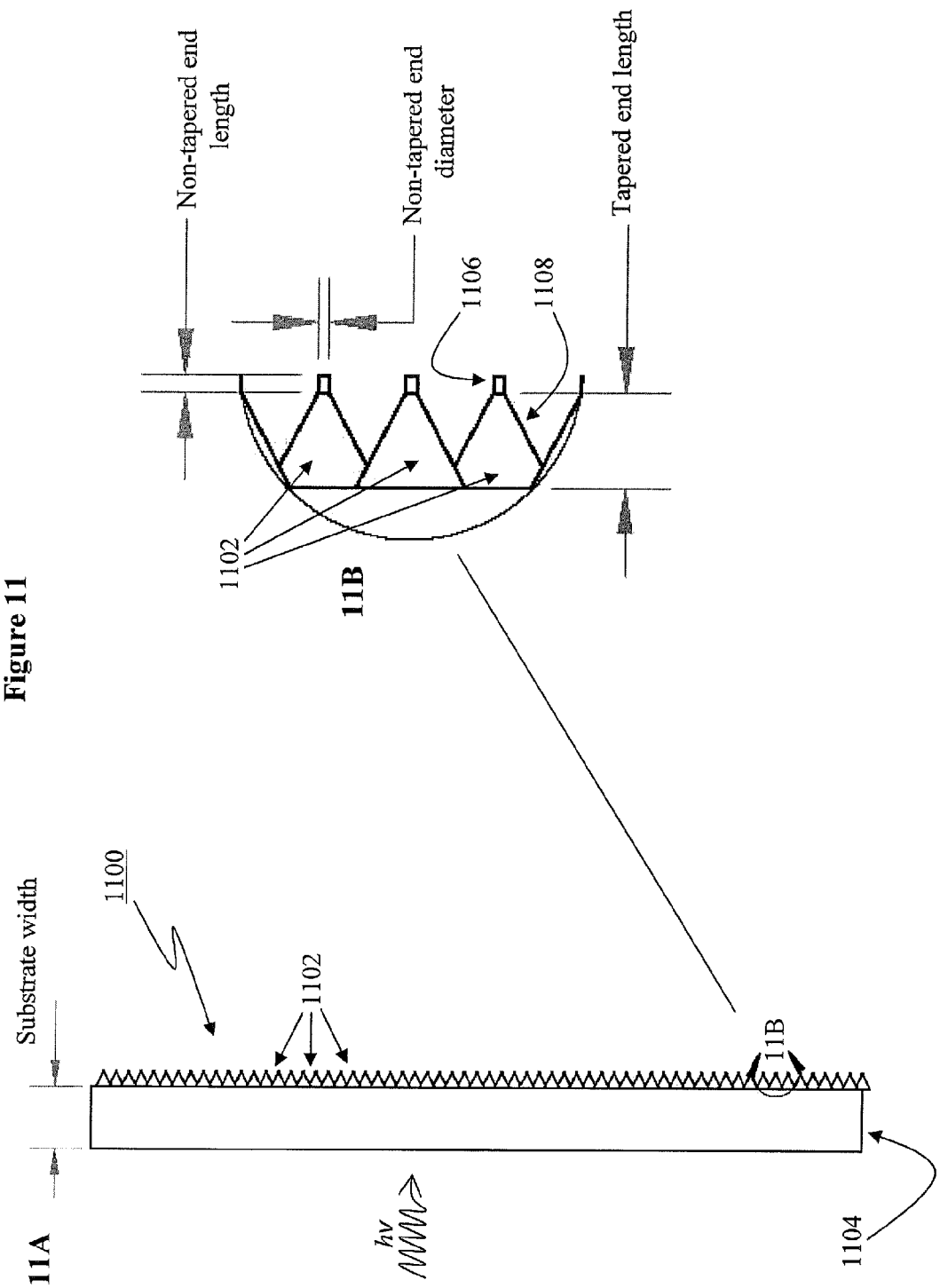
FIG. 11 illustrates a cross sectional view of the array of pixels of FIG. 10.

FIG. 11 is a cross sectional view of the array of pixels of FIG. 10. Array (1100) comprises a plurality of pixels (1102) arrayed on a substrate (1104). Each pixel (1102) comprises a photovoltaic cell comprising a tapered optoelectronic device described herein.

In some embodiments, arrays of pixels described herein can be produced by stamping. For example, in some embodiments, a method of producing an array of pixels comprises providing a substrate and stamping or molding one side of the substrate to provide an array of fiber cores having a tapered end and a non-tapered end. The method further comprises disposing a radiation transmissive first electrode on a surface of the fiber core, disposing at least one photosensitive inorganic layer in electrical communication with the first electrode, and disposing a second electrode in electrical communication with the photosensitive inorganic layer. Disposing the radiation transmissive first electrode, the at least one photosensitive inorganic layer, and the second electrode can comprise disposing in any manner described herein. In some embodiments, disposing the radiation transmissive first electrode comprises disposing the radiation transmissive first electrode on a surface of the non-tapered end of the fiber core. In addition, the photosensitive inorganic layer can comprise any photosensitive inorganic layer described herein.

Further, the substrate can comprise any material not inconsistent with the objectives of the present invention. In some embodiments, the substrate comprises plastic. In some embodiments, the substrate can be at least partially radiation transmissive. Therefore, arrays of pixels produced by stamping or molding a radiation transmissive substrate can, in some embodiments, permit the coupling of electromagnetic radiation into the array through the unstamped side of the substrate.

In another aspect, methods of producing optoelectronic devices are described herein. In some embodiments, a method of producing an optoelectronic device comprises providing a fiber core, disposing a radiation transmissive first electrode on a surface of the fiber core, disposing at least one photosensitive inorganic layer in electrical communication with the first electrode, and disposing a second electrode in electrical communication with the photosensitive inorganic layer. The photosensitive inorganic layer can comprise any photosensitive inorganic layer described herein. In some embodiments, for example, the photosensitive inorganic layer comprises substantially unpassivated amorphous silicon or hydrogen passivated amorphous silicon. In some embodiments, the photosensitive inorganic layer consists essentially of substantially unpassivated amorphous silicon or hydrogen passivated amorphous silicon.

Moreover, components of the optoelectronic device, including the optical fiber core, radiation transmissive first electrode, photosensitive inorganic layer and second electrode can have any construction and/or properties recited for the same herein.

Further, methods of producing an optoelectronic device described herein can be used to produce an optoelectronic device having any combination of features of optoelectronic devices described herein not inconsistent with the objectives of the present invention. In some embodiments, for example, the photosensitive inorganic layer of an optoelectronic device produced by a method described herein is less than about 300 nm thick and the device has a conversion efficiency of at least about 3%.

Disposing a radiation transmissive first electrode on a fiber core, in some embodiments, comprises sputtering or dip coating a radiation transmissive conductive oxide onto a surface of the fiber core. In some embodiments, disposing a photosensitive inorganic layer in electrical communication with the first electrode comprises depositing the inorganic layer using one or more standard fabrication methods, including one or more of solution-based methods, vapor deposition methods, and epitaxy methods. In some embodiments, the chosen fabrication method is based on the type of inorganic photosensitive layer deposited. In some embodiments wherein an amorphous silicon layer is deposited as the photosensitive inorganic layer, the amorphous silicon layer is not passivated. Alternatively, in some embodiments, the amorphous silicon layer is passivated with hydrogen. In some embodiments, the amorphous silicon layer is not passivated with a halogen, such as fluorine. In some embodiments, an inorganic photosensitive layer comprising a-Si:H can be deposited using plasma enhanced chemical vapor deposition (PECVD) including RF PECVD, DC PECVD, VHF PECVD or microwave PECVD. In some embodiments, an inorganic photosensitive layer comprising a-Si:H can be deposited using hot wire chemical vapor deposition (HWCVD), sputtering or photo-CVD. Using PECVD or HWCVD to deposit an inorganic photosensitive layer comprising a-Si:H, in some embodiments, can permit the formation of a PIN structure of a-Si:H. In other embodiments, an inorganic photosensitive layer comprising CdTe can be deposited using PECVD. In some embodiments, an inorganic photosensitive layer comprising CZTS can be deposited using PECVD, HWCVD, or solution methods. In still other embodiments, depositing an inorganic photosensitive layer comprising CIGS can comprise depositing nanoparticles comprising CIGS. Nanoparticles can be deposited in any manner not inconsistent with the objectives of the present invention. In some embodiments, an inorganic photosensitive layer can be deposited by one or more of chemical vapor deposition (CVD), physical vapor deposition (PVD), molecular beam epitaxy (MBE), atomic layer epitaxy (ALE), solution atomic layer epitaxy (SALE) or pulsed laser deposition (PLD).

Disposing a second electrode in electrical communication with the photosensitive inorganic layer, in some embodiments, comprises depositing the second electrode on the inorganic layer through vapor phase deposition, spin coating, or dip coating.

Methods of producing an optoelectronic device, in some embodiments, further comprise annealing the photosensitive inorganic layer or layers. In some embodiments, annealing comprises heating at a temperature and for a time sufficient to alter the microstructure of the photosensitive inorganic layer or layers.

In some embodiments, a method for producing an optoelectronic device further comprises disposing at least one upconverter and/or scattering agent in the fiber core.

Materials suitable for use in methods of producing optoelectronic devices described herein include those materials provided herein for optoelectronic devices having a fiber structure described herein.

In another aspect, methods of converting electromagnetic energy into electrical energy are described herein. In some embodiments, a method of converting electromagnetic energy into electrical energy comprises receiving electromagnetic radiation along the longitudinal axis of an optical fiber, transmitting the radiation into at least one photosensitive inorganic layer through a radiation transmissive electrode surrounding the optical fiber, generating excitons in the inorganic layer, and separating the excitons into electrons and holes. In some embodiments, the optical fiber comprises any optical fiber described herein. In some embodiments, the at least one photosensitive inorganic layer comprises any photosensitive inorganic layer described herein. In some embodiments, the radiation transmissive electrode comprises any radiation transmissive electrode described herein.

In some embodiments, receiving electromagnetic radiation comprises receiving visible radiation. In some embodiments, receiving electromagnetic radiation comprises receiving infrared radiation.

In some embodiments, transmitting the electromagnetic radiation into the at least one photosensitive inorganic layer comprises transmitting the radiation through evanescence fields. In other embodiments, transmitting the radiation into the at least one photosensitive inorganic layer comprises upconverting or downconverting at least a portion of the radiation received along the longitudinal axis of the optical fiber. Upconverting, in some embodiments, comprises absorbing radiation received along the longitudinal axis of an optical fiber with an upconversion material to create an excited state and emitting radiation into the at least one photosensitive layer to relax the excited state, wherein the emitted radiation has a shorter wavelength than the absorbed radiation. In some embodiments, the portion of radiation absorbed by the upconversion material comprises infrared radiation. In some embodiments, transmitting the electromagnetic radiation received along the longitudinal axis of the optical fiber into the at least one photosensitive inorganic layer comprises scattering the radiation into the photosensitive inorganic layer with a scattering agent.

In some embodiments, separating the excitons into electrons and holes comprises providing a voltage across the radiation transmissive electrode surrounding the optical fiber and an additional electrode surrounding the photosensitive inorganic layer. The additional electrode can comprise any second electrode described herein. In some embodiments, the excitons are separated at one or more heterojunctions in the photosensitive inorganic layer. In some embodiments, a heterojunction comprises a bulk heterojunction. As discussed herein, a bulk heterojunction is formed at the interface of a donor material and an acceptor material. Donor and acceptor materials suitable for use in methods described herein are consistent with those provided herein for optoelectronic devices.

A method of converting electromagnetic energy into electrical energy, in some embodiments, can further comprise removing the electrons into an external circuit.

In some embodiments of methods of converting electromagnetic energy into electrical energy described herein, wave-guiding may be utilized to increase the efficiency of the conversion. In some embodiments, a method comprises receiving an electromagnetic wave and guiding the electromagnetic wave to transmit radiation into a photosensitive inorganic layer. In some embodiments, guiding the electromagnetic wave to transmit radiation into a photosensitive inorganic layer can comprise creating total internal reflection of the electromagnetic wave at an interface of a photosensitive inorganic layer and an adjacent layer to produce evanescent waves or fields in the photosensitive inorganic layer.

In another aspect, methods of reducing efficiency losses in amorphous silicon photovoltaic devices resulting from the Staebler-Wronski effect (SWE) are described herein. In some embodiments, a method comprises reducing efficiency loss in an amorphous silicon photovoltaic device resulting from the Staebler-Wronski effect, wherein reducing efficiency losses comprises disposing an amorphous silicon photosensitive layer in electrical communication with a radiation transmissive first electrode surrounding a fiber core, disposing a non-radiation transmissive second electrode in electrical communication with the amorphous silicon photosensitive layer, receiving electromagnetic radiation along the longitudinal axis of the fiber core and transmitting the radiation into the amorphous silicon photosensitive layer for the generation of a photocurrent. In some embodiments, the amorphous silicon photosensitive layer surrounds the radiation transmissive first electrode, and the second electrode surrounds the amorphous silicon photosensitive layer. In some embodiments, the amorphous silicon photovoltaic device demonstrates less than about a 20% reduction in initial conversion efficiency or less than about a 15% reduction in initial conversion efficiency from the Staebler-Wronski effect. In some embodiments, the photovoltaic device demonstrates less than about a 10% reduction in initial conversion efficiency from the Staebler-Wronski effect. The amorphous silicon photovoltaic device, in some embodiments, demonstrates less than about a 5% reduction in initial conversion efficiency or less than about a 3% reduction in initial conversion efficiency from the Staebler-Wronski effect. Moreover, in some embodiments, the amorphous silicon photosensitive layer of the device is hydrogen passivated (a-Si:H). In some embodiments, the amorphous silicon photosensitive layer is non-halogen passivated. Alternatively, in some embodiments, the amorphous silicon photosensitive layer is fluorine passivated (a-Si:F). Moreover, an amorphous silicon photosensitive layer can have any construction and/or properties described herein for an amorphous silicon photosensitive layer. In some embodiments, the amorphous silicon photovoltaic device is a single junction device or a multi junction device.

Additionally, the photovoltaic device comprising the amorphous silicon layer can have any property or combination of properties, including conversion efficiencies, recited herein for a photovoltaic device. In some embodiments, amorphous silicon photovoltaic devices of methods of reducing SWE efficiency losses can comprise any fiber core, first electrode and second electrode described herein. In some embodiments, the amorphous silicon photovoltaic device displays a stabilized conversion efficiency ranging from about 8-15% or from about 10-15%.

These and other embodiments can be further understood with reference to the following non-limiting example.

Example 1

Array of Optoelectronic Devices

An array of optoelectronic devices described herein and illustrated according to FIGS. 10 and 11 is constructed as follows. An array of plastic optical fibers is coated with a $SiO_2$ or $TiO_2$ planarizing and adhesion layer. A layer of $SiO_2$, for example, is spin-coated onto the plastic optical fiber array from a $SiO_2$ sol at 1000 rpm. The $SiO_2$ sol is formed by stirring and aging a mixture of tetraethylorthosilicate (TEOS), ethanol, hydrochloric acid, and water. After allowing the deposited $SiO_2$ layer to dry overnight, ITO is sputter deposited onto the $SiO_2$ coated fiber array. A photosensitive layer of a-Si:H is then deposited onto the ITO layer using reactive radio frequency plasma-enhanced chemical vapor deposition (RF PECVD) from a Si source. The a-Si:H photosensitive layer is deposited in a p-i-n sequence. First, a 100 nm thick layer of p-doped a-Si:H is deposited. Next, a 200 nm layer of intrinsic a-Si:H is deposited. Then a 100 nm layer of n-doped a-Si:H is deposited. The p-doped a-Si:H is doped with boron, and the n-doped a-Si:H is doped with phosphorus. After depositing the a-Si:H photosensitive layer, an Al or Ag electrode is deposited by thermal evaporation.

Various embodiments of the invention have been described in fulfillment of the various objects of the invention. It should be recognized that these embodiments are merely illustrative of the principles of the present invention. Numerous modifications and adaptations thereof will be readily apparent to those skilled in the art without departing from the spirit and scope of the invention.

That which is claimed is:

1. A method comprising:
   reducing efficiency loss in an amorphous silicon photovoltaic device resulting from the Staebler-Wronski effect, wherein reducing efficiency loss comprises:
   disposing an amorphous silicon photosensitive layer comprising hydrogen passivated amorphous silicon (a-Si:H) in electrical communication with a radiation transmissive first electrode surrounding a fiber core;
   disposing a non-radiation transmissive second electrode in electrical communication with the amorphous silicon photosensitive layer;
   receiving electromagnetic radiation along the longitudinal axis of the fiber core; and
   transmitting the received electromagnetic radiation into the amorphous silicon layer for generation of a photocurrent, wherein the amorphous silicon photovoltaic device demonstrates less than about a 20 percent reduction in initial conversion efficiency from the Staebler-Wronski effect.

2. The method of claim 1, wherein the amorphous silicon photovoltaic device demonstrates less than about a 15 percent reduction in initial conversion efficiency from the Staebler-Wronski effect.

3. The method of claim 1, wherein the amorphous silicon photovoltaic device demonstrates less than about a 10 percent reduction in initial conversion efficiency from the Staebler-Wronski effect.

4. The method of claim 1, wherein the amorphous silicon photosensitive layer has a thickness less than about 500 nm.

5. The method of claim 4, wherein the amorphous silicon photovoltaic device has a stabilized conversion efficiency ranging from about 8% to about 15%.

6. The method of claim 4, wherein the amorphous silicon photovoltaic device has a stabilized conversion efficiency ranging from about 10% to about 15%.

7. The method of claim 1, wherein the amorphous silicon photosensitive layer has a thickness less than about 300 nm.

8. The method of claim 1, wherein the amorphous silicon photosensitive layer further comprises fluorine passivated (a-Si:F) amorphous silicon.

9. The method of claim 1, wherein the amorphous silicon photosensitive layer comprises a p-intrinsic-n architecture.

10. The method of claim 1, wherein the amorphous silicon photovoltaic device is a single junction device.

11. The method of claim 1, wherein the fiber core comprises a tapered end and a non-tapered end.

12. The method of claim 11, wherein the tapered end has a conical geometry.

13. The method of claim 12, wherein the maximum diameter of the tapered end is at least about 5 times greater than the maximum diameter of the non-tapered end.

14. The method of claim 13, wherein the length of the tapered end is at least about 5 times greater than the length of the non-tapered end.

15. The method of claim 12, wherein the maximum diameter of the tapered end is at least about 10 times greater than the maximum diameter of the non-tapered end.

16. The method of claim 1, wherein the radiation transmissive first electrode is a radiation transmissive conducting oxide.

* * * * *